United States Patent
Eakins

(10) Patent No.: US 9,783,302 B2
(45) Date of Patent: Oct. 10, 2017

(54) METHOD OF DETERMINING A SEATING ARRANGEMENT

(71) Applicant: The Boeing Company, Chicago, IL (US)

(72) Inventor: Mark E. Eakins, Kirkland, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 15/202,492

(22) Filed: Jul. 5, 2016

(65) Prior Publication Data

US 2016/0311535 A1    Oct. 27, 2016

Related U.S. Application Data

(62) Division of application No. 14/278,907, filed on May 15, 2014, now Pat. No. 9,409,648.

(51) Int. Cl.
| | | |
|---|---|---|
| *B64D 11/06* | (2006.01) | |
| *B64F 5/00* | (2017.01) | |
| *G06F 17/50* | (2006.01) | |

(52) U.S. Cl.
CPC .......... *B64D 11/0601* (2014.12); *B64D 11/06* (2013.01); *B64D 11/0606* (2014.12); *B64D 11/0641* (2014.12); *B64D 11/0643* (2014.12); *B64F 5/00* (2013.01); *G06F 17/50* (2013.01); *G06F 17/5095* (2013.01)

(58) Field of Classification Search
None
See application file for complete search history.

(56) References Cited

U.S. PATENT DOCUMENTS

| | | |
|---|---|---|
| 2,608,366 A | 8/1952 | Jergenson |
| 2,859,803 A | 11/1958 | Mccallister |
| 4,936,620 A | 6/1990 | Francois et al. |

(Continued)

FOREIGN PATENT DOCUMENTS

| | | |
|---|---|---|
| EP | 2289798 | 3/2011 |
| EP | 2907754 | 8/2015 |

(Continued)

OTHER PUBLICATIONS

European Search Report dated Oct. 9, 2015 for EP15167762.
European Office Action dated Aug. 5, 2016 for EP15167762.2.

*Primary Examiner* — Medhat Badawi

(57) ABSTRACT

A method of determining a seating arrangement for an aircraft cabin includes entering configuration parameters into a processor including a cabin width, a quantity of aisles, a minimum aisle width, and a quantity of columns of seats, wherein each seat is movable between a seated configuration and a bed configuration. The method additionally includes entering seat parameters describing the taper in seat width from a main portion to a footrest, and entering configuration rules wherein in at least one column of an inboard column set and/or an outboard column set, the seats are reversed in direction and/or are staggered. The method further includes determining, using the processor, a seating arrangement including a column quantity in each column set, and a seat direction and/or a stagger for each column in the seating arrangement that results in a maximum seat width at a main portion of the seats.

21 Claims, 20 Drawing Sheets

(56) References Cited

U.S. PATENT DOCUMENTS

| | | | |
|---|---|---|---|
| 5,083,838 A | 1/1992 | Maxwell, Jr. | |
| 5,716,026 A | 2/1998 | Pascasio et al. | |
| 5,740,989 A | 4/1998 | Daines | |
| 5,947,541 A | 9/1999 | Behrens et al. | |
| D421,948 S | 3/2000 | Dryburgh et al. | |
| 6,059,364 A | 5/2000 | Dryburgh et al. | |
| 6,113,644 A * | 9/2000 | Weber | G06F 17/5095 345/419 |
| 6,132,108 A * | 10/2000 | Kashiwamura | G06F 17/50 703/2 |
| 6,237,872 B1 | 5/2001 | Bar-Levav | |
| 6,663,173 B1 | 12/2003 | Corfitsen | |
| 6,766,986 B2 | 7/2004 | Konya | |
| 7,025,306 B2 | 4/2006 | Saint Jalmes | |
| 7,156,346 B2 | 1/2007 | Mercier | |
| 7,188,806 B2 | 3/2007 | Beroth | |
| 7,320,446 B2 | 1/2008 | Saint-Jalmes et al. | |
| 7,578,470 B2 | 8/2009 | Plant | |
| 7,721,990 B2 | 5/2010 | Jaeger et al. | |
| 8,220,741 B2 | 7/2012 | Barmichev et al. | |
| 8,382,036 B2 | 2/2013 | Ruiter et al. | |
| 8,423,324 B2 | 4/2013 | Boin | |
| 8,864,071 B2 | 10/2014 | Vergnaud et al. | |
| 8,944,379 B2 | 2/2015 | Orson et al. | |
| 8,954,301 B2 * | 2/2015 | Sieben | G06F 17/5095 244/114 R |
| 8,998,139 B2 | 4/2015 | Dryburgh et al. | |
| 9,132,917 B2 | 9/2015 | Savian | |
| 2001/0003962 A1 | 6/2001 | Park et al. | |
| 2001/0005074 A1 * | 6/2001 | Sakai | G01G 19/4142 280/728.1 |
| 2002/0026296 A1 * | 2/2002 | Lohmann | G05B 19/409 703/1 |
| 2003/0018454 A1 * | 1/2003 | Winkler | G06F 17/5095 703/1 |
| 2004/0010398 A1 * | 1/2004 | Noma | G06F 17/5095 703/1 |
| 2004/0195451 A1 | 10/2004 | Bentley et al. | |
| 2005/0001097 A1 | 1/2005 | Saint-Jalmes | |
| 2005/0001098 A1 | 1/2005 | Saint-Jalmes | |
| 2005/0055180 A1 | 3/2005 | Pischke et al. | |
| 2005/0071138 A1 * | 3/2005 | Conchi | B64D 11/06 703/8 |
| 2005/0209830 A1 * | 9/2005 | Lee | G06F 17/5095 703/1 |
| 2007/0040434 A1 | 2/2007 | Plant | |
| 2007/0045468 A1 | 3/2007 | Casey | |
| 2007/0233433 A1 * | 10/2007 | Lee | G06F 17/5095 703/1 |
| 2007/0233434 A1 * | 10/2007 | Lee | G06F 17/5095 703/1 |
| 2008/0009958 A1 * | 1/2008 | Abt | B60N 2/0244 700/29 |
| 2008/0088160 A1 | 4/2008 | Johnson | |
| 2009/0066121 A1 | 3/2009 | Jacob | |
| 2010/0038484 A1 | 2/2010 | Ersan | |
| 2010/0038485 A1 | 2/2010 | Harcup | |
| 2012/0146372 A1 | 6/2012 | Ferry | |
| 2012/0223186 A1 | 9/2012 | Henshaw | |
| 2012/0239354 A1 * | 9/2012 | Sieben | G06F 17/5095 703/1 |
| 2012/0292957 A1 | 11/2012 | Vergnaud et al. | |
| 2012/0298798 A1 | 11/2012 | Henshaw et al. | |
| 2013/0032668 A1 | 2/2013 | Foucher et al. | |
| 2013/0068887 A1 | 3/2013 | Ko | |
| 2013/0106156 A1 | 5/2013 | Orson et al. | |
| 2014/0306500 A1 | 10/2014 | Dryburgh et al. | |
| 2015/0136905 A1 | 5/2015 | Orson et al. | |
| 2015/0225086 A1 | 8/2015 | Darbyshire | |

FOREIGN PATENT DOCUMENTS

| | | |
|---|---|---|
| WO | WO2013136080 | 9/2013 |
| WO | WO2014006607 | 1/2014 |

* cited by examiner

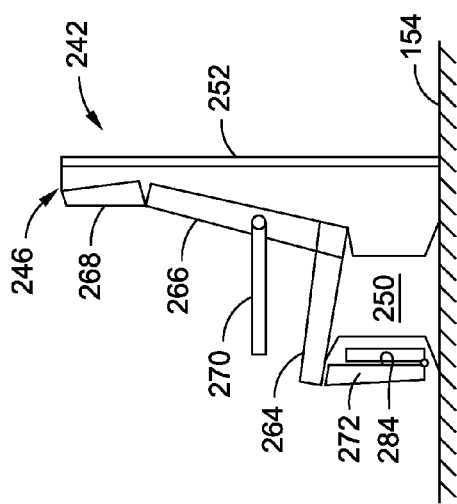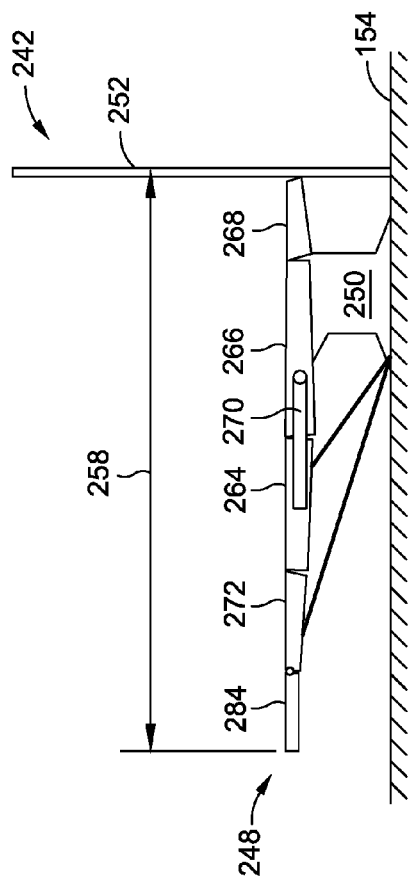

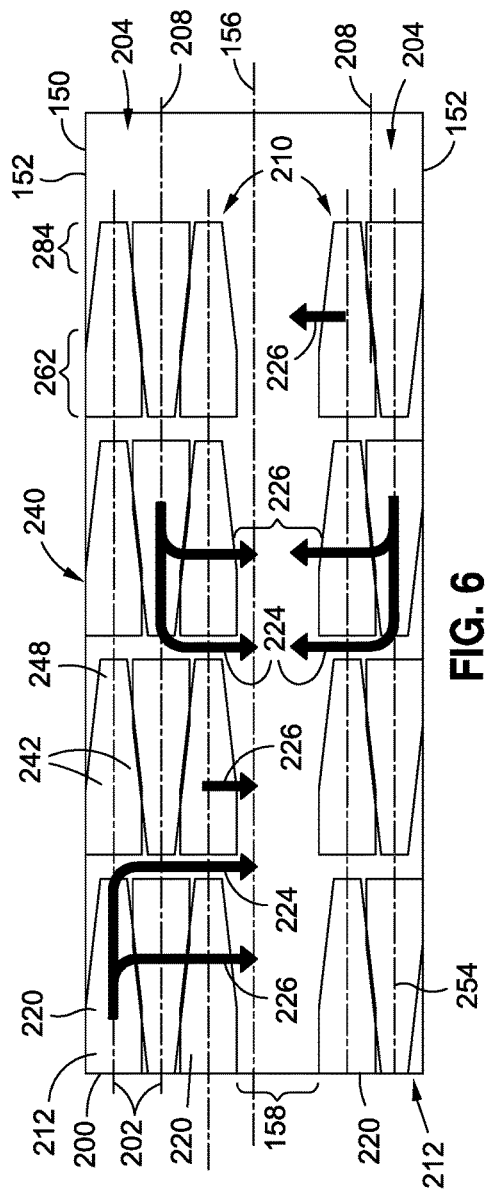
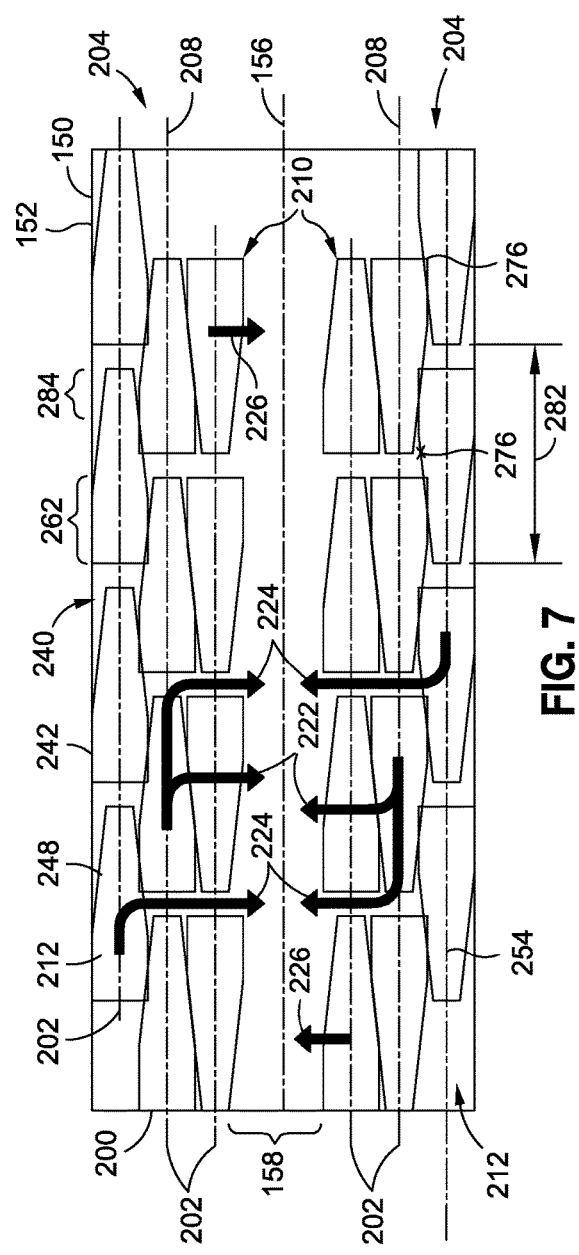
FIG. 6
FIG. 7

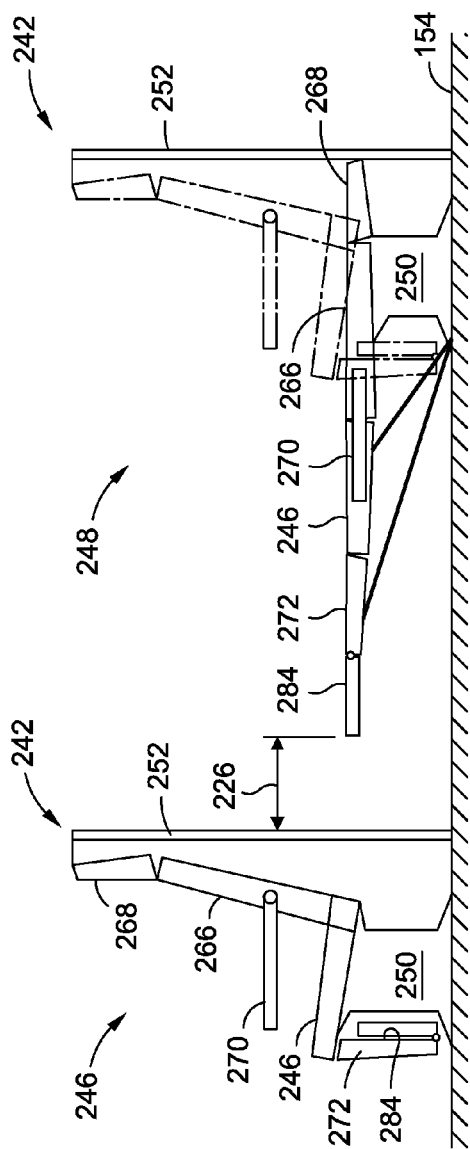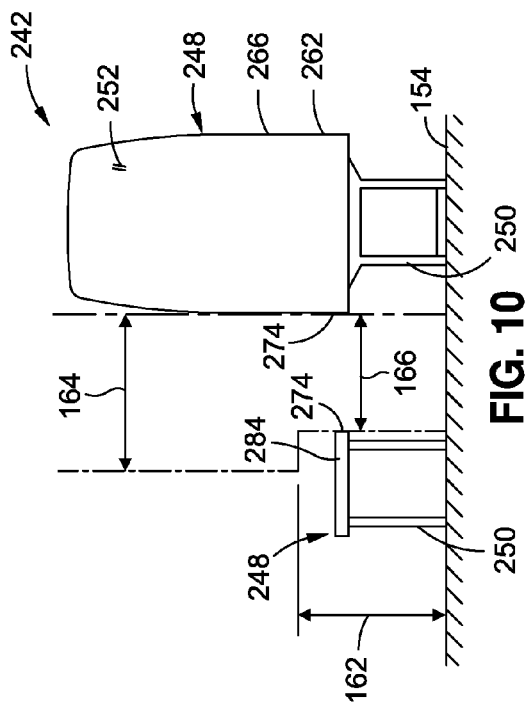

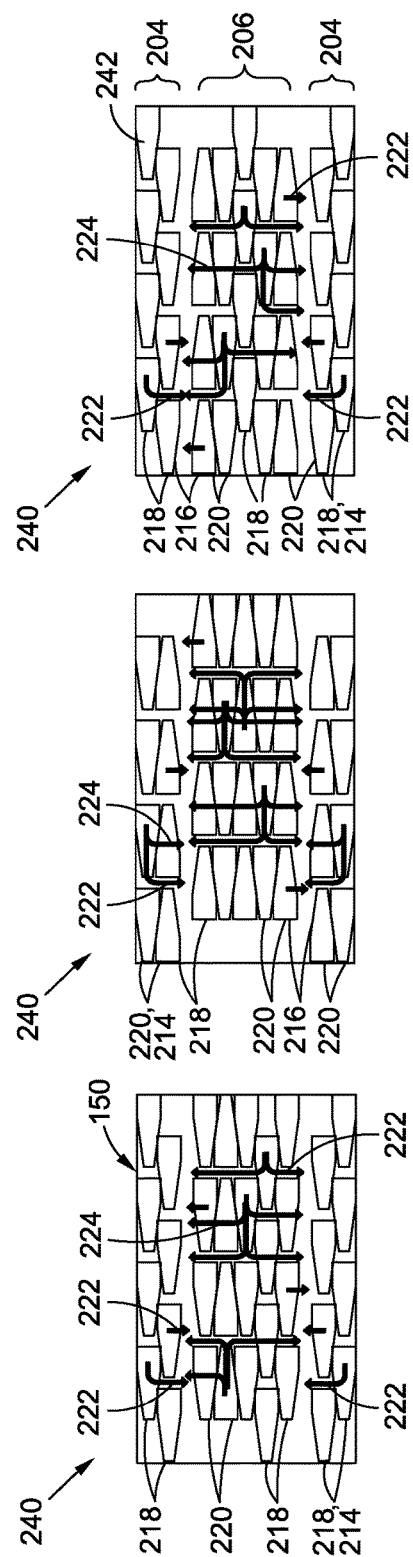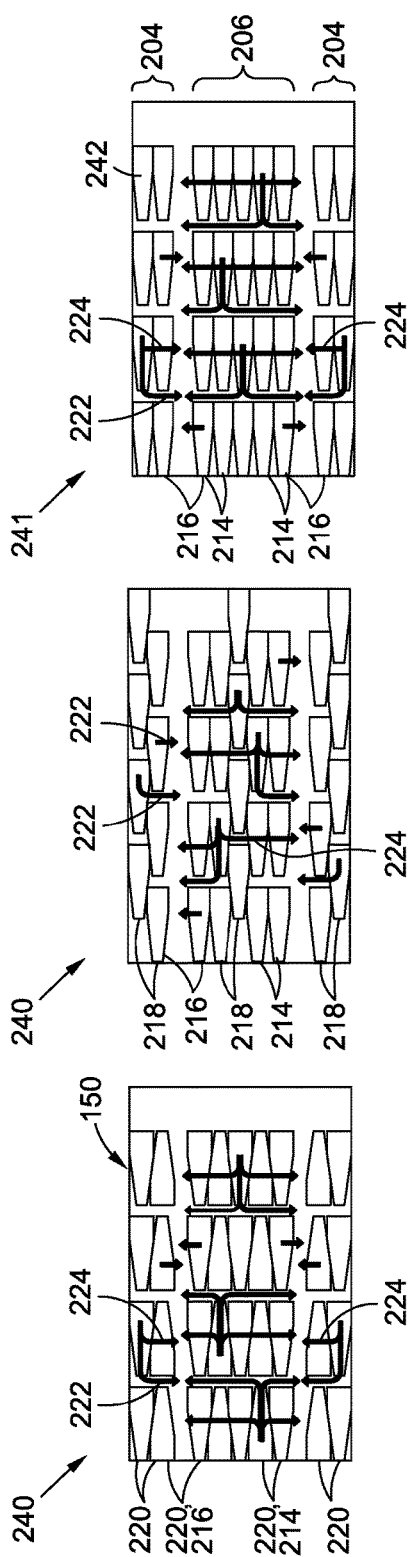

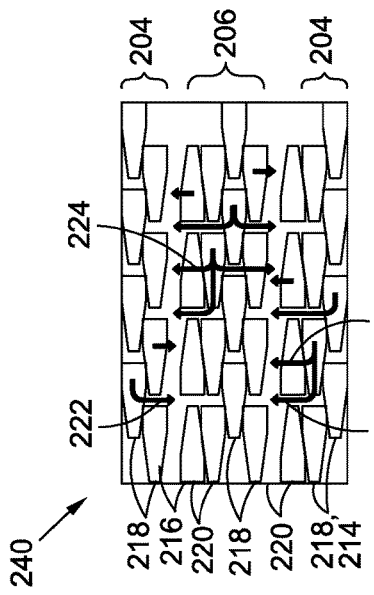
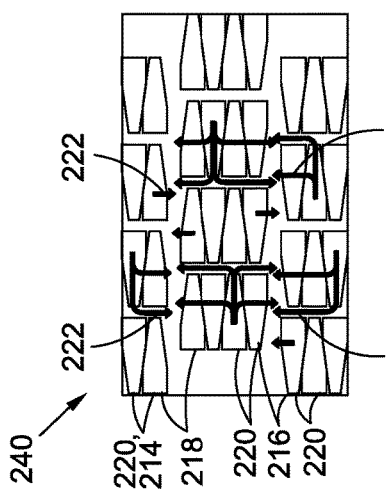
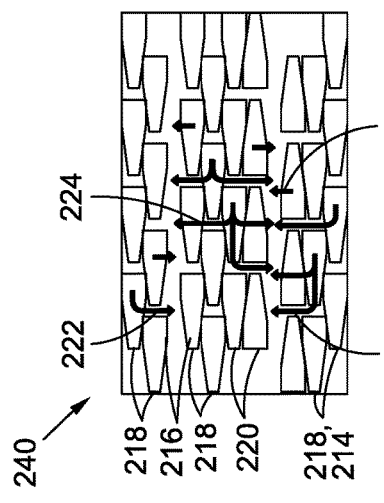
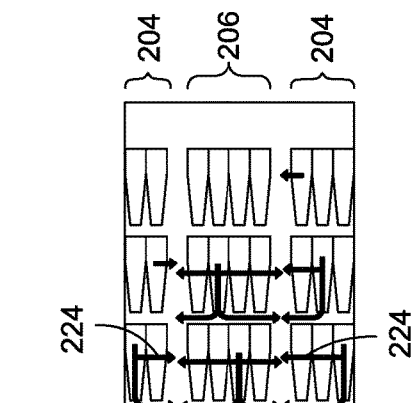
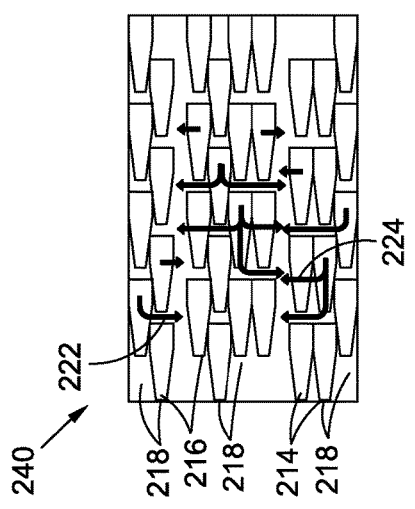
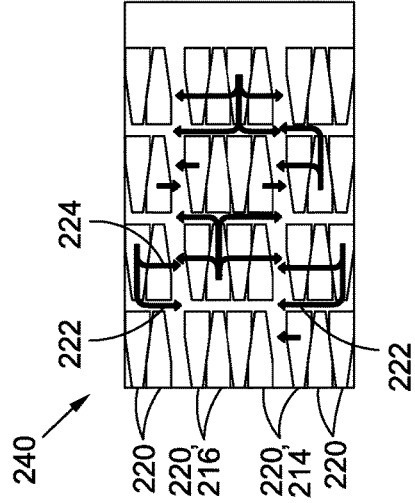

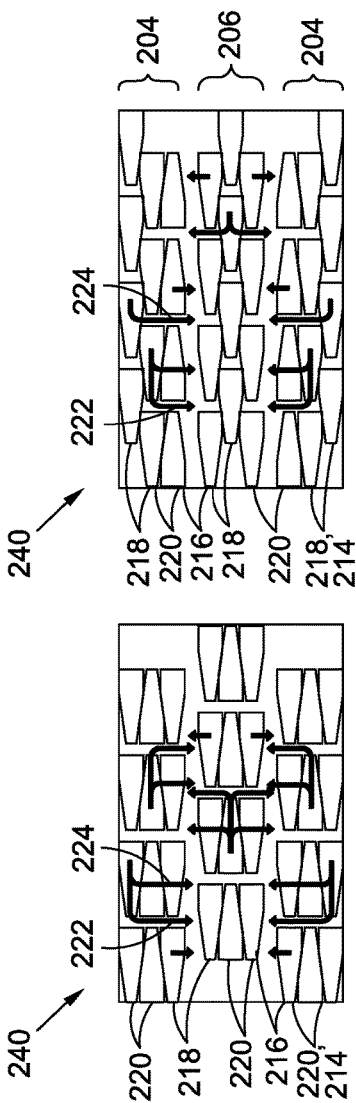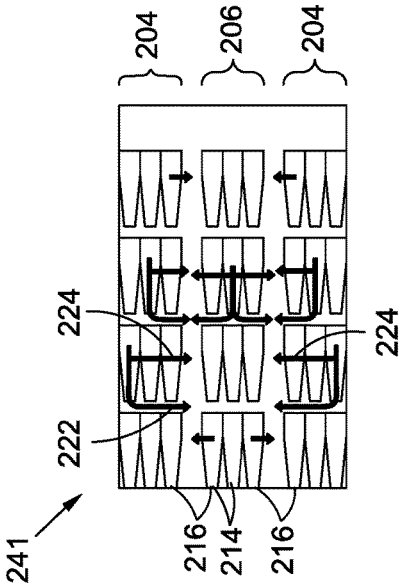

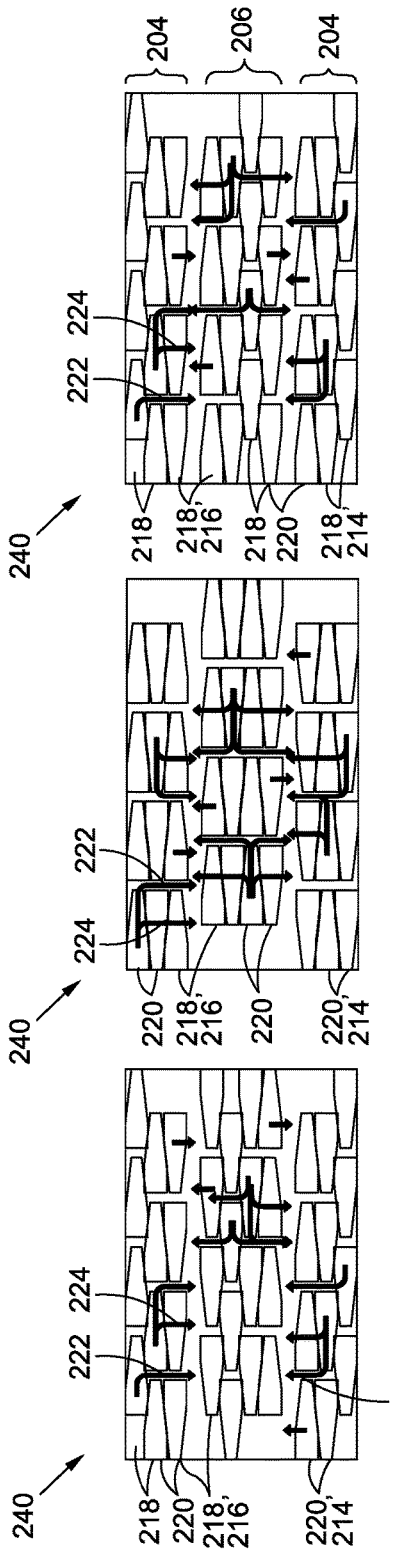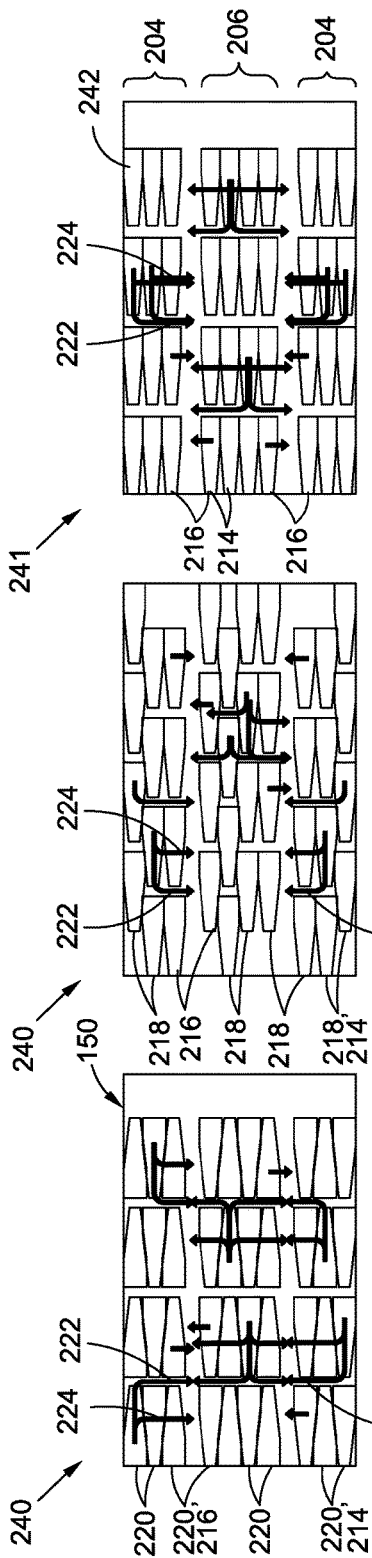

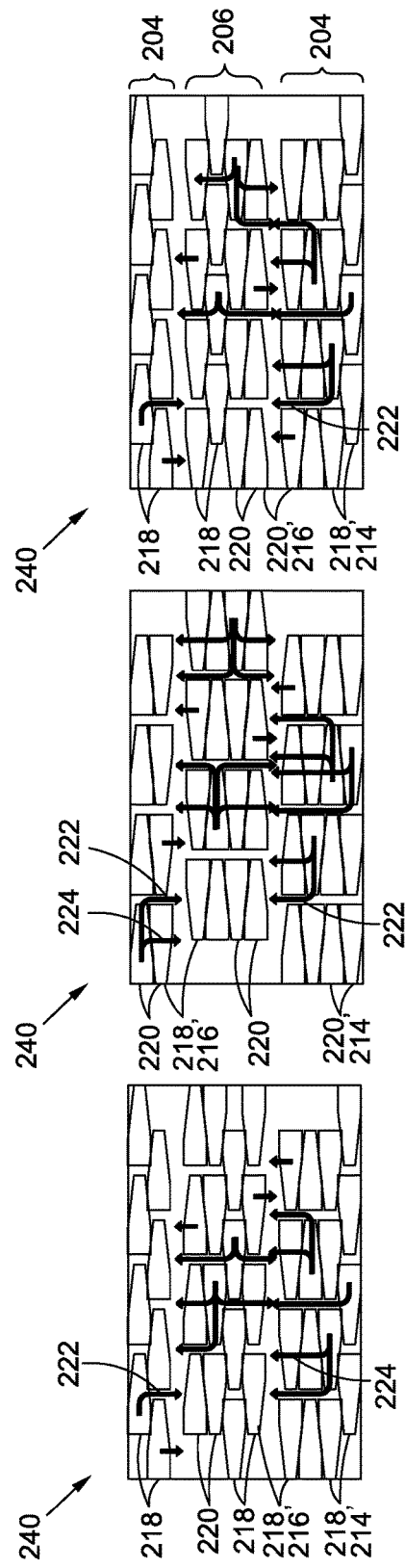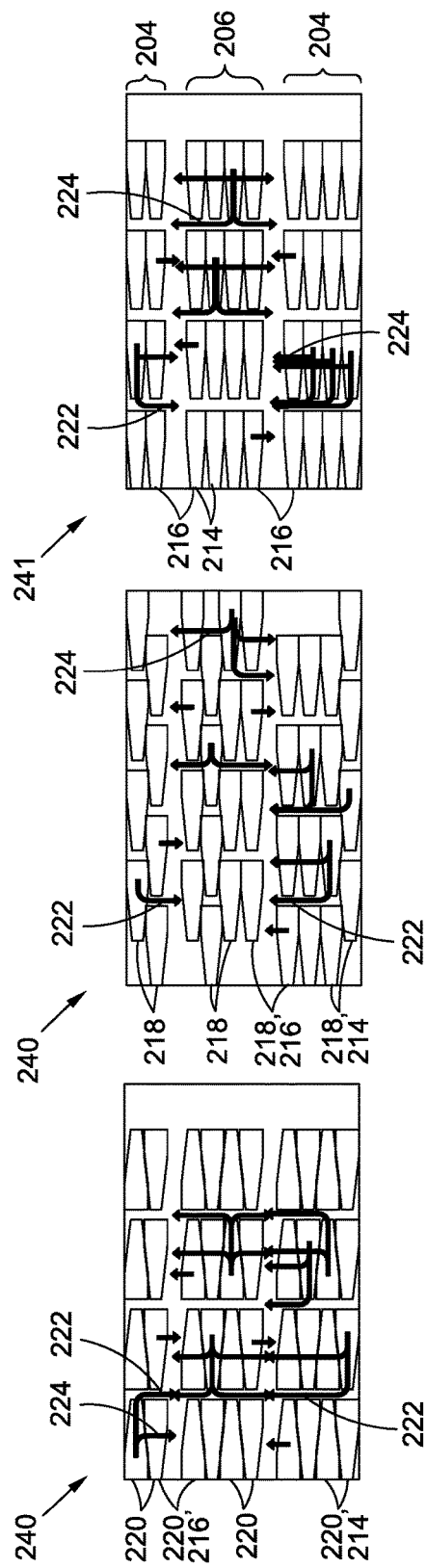

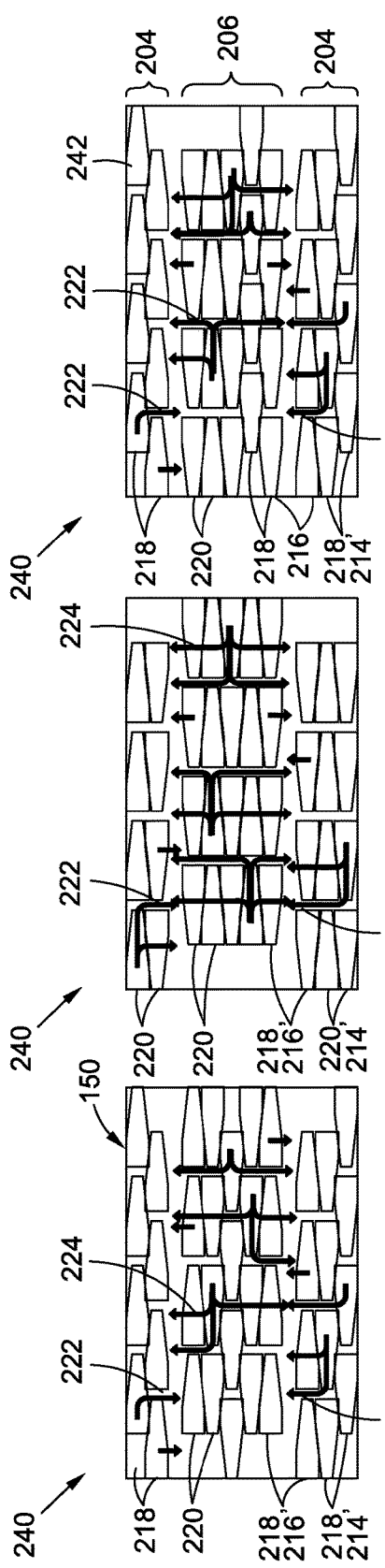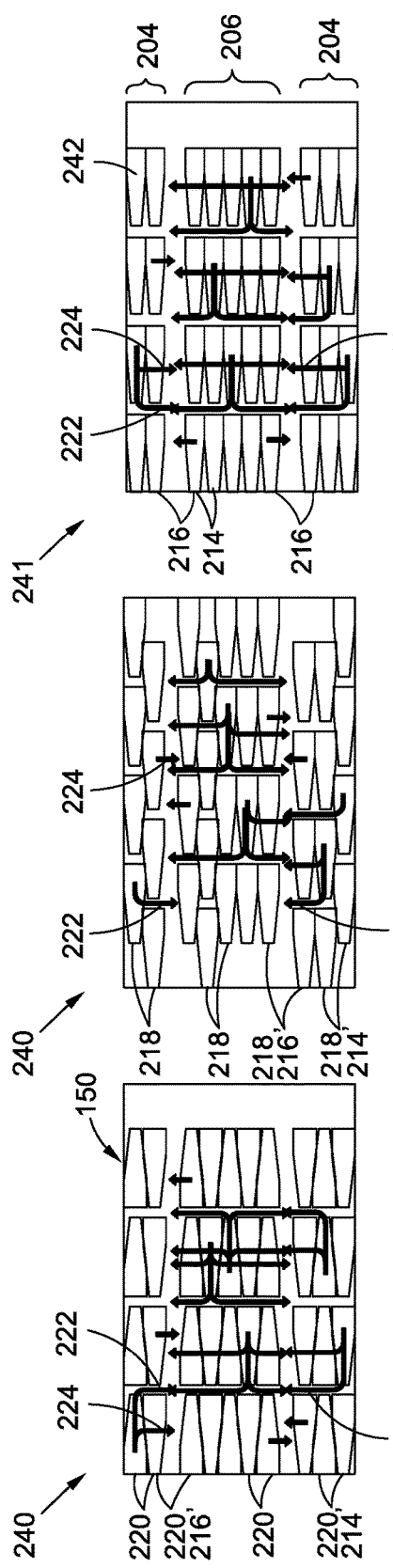

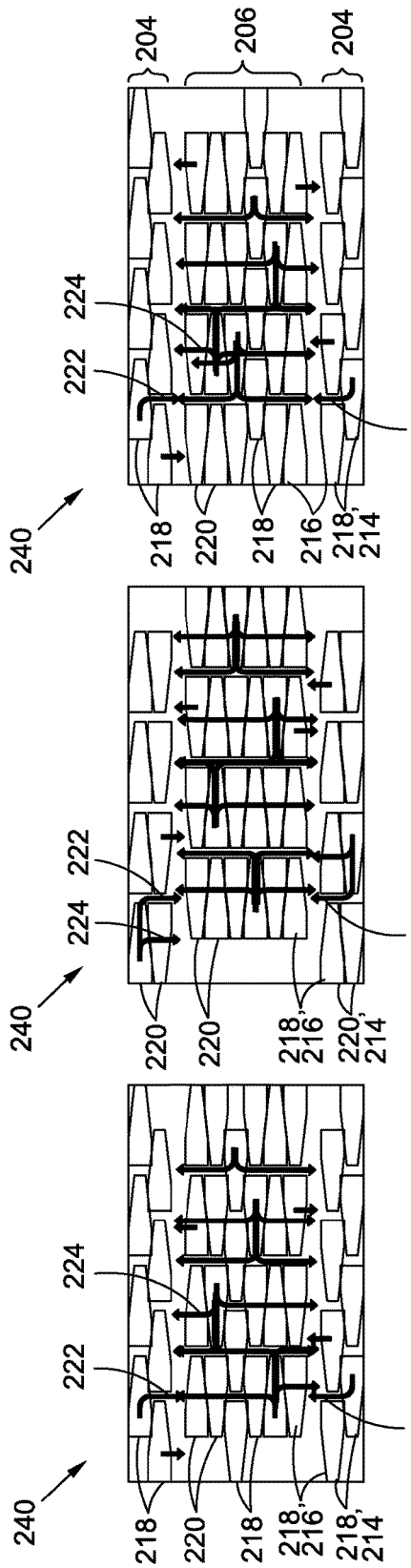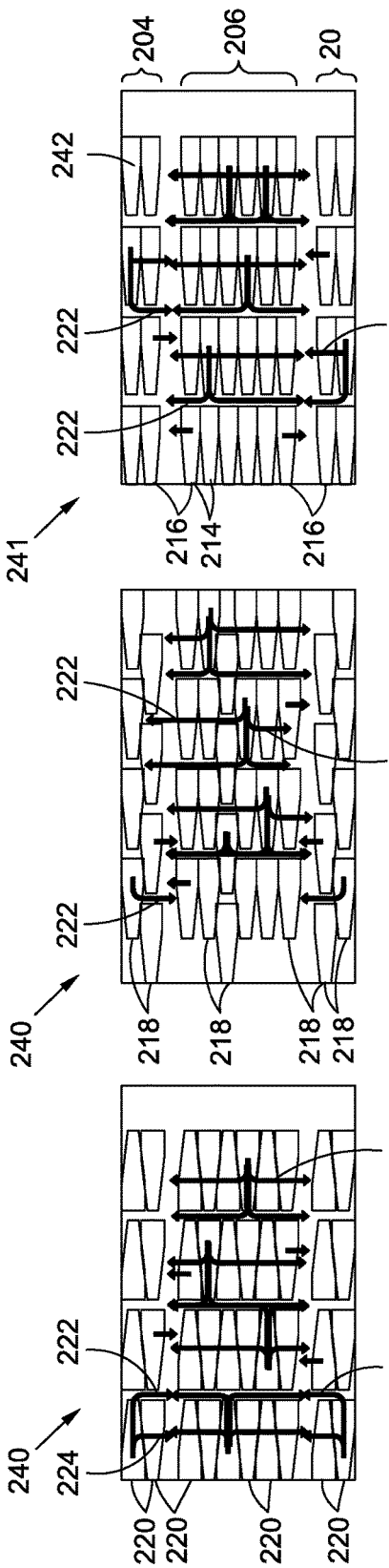

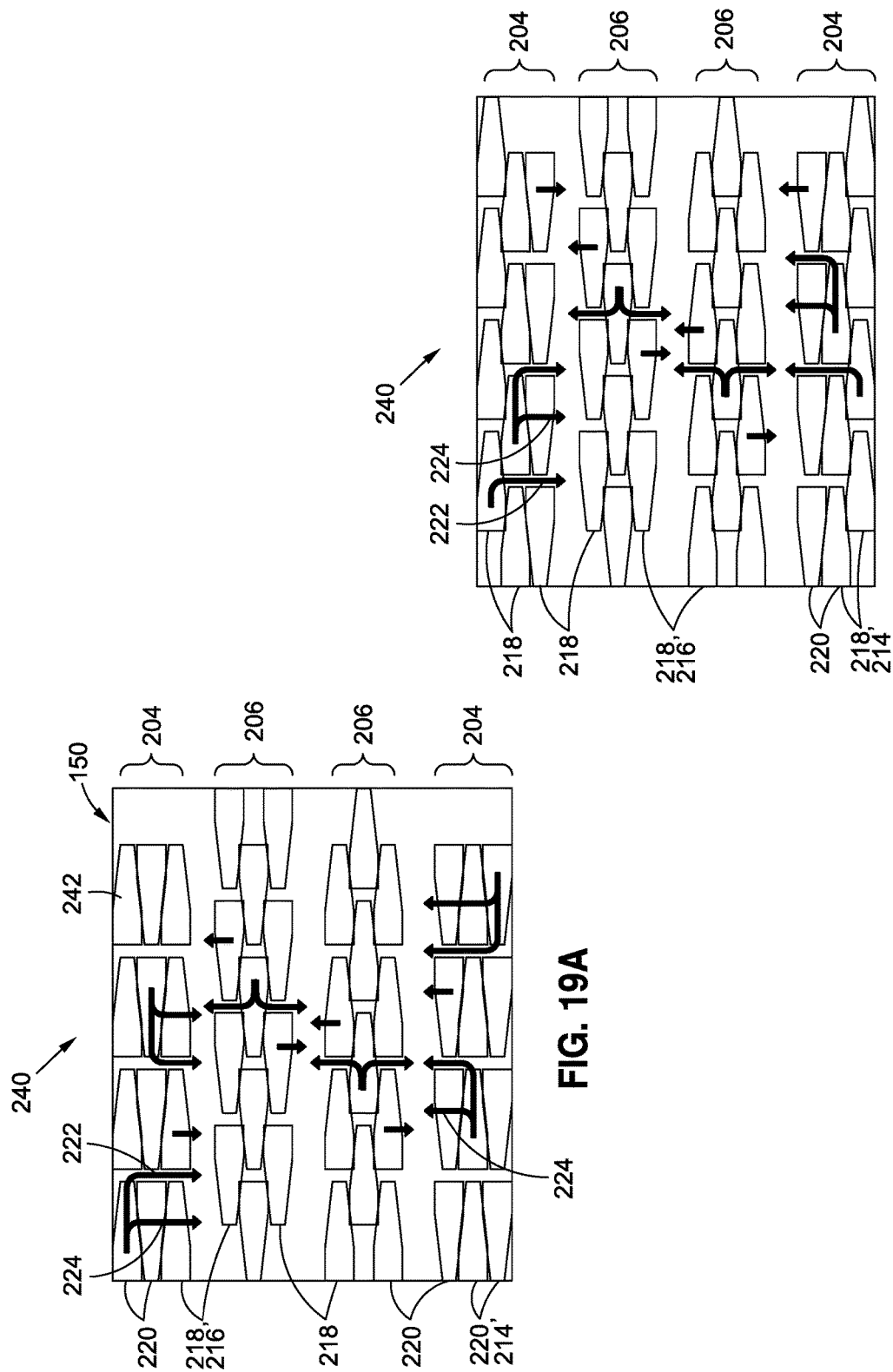

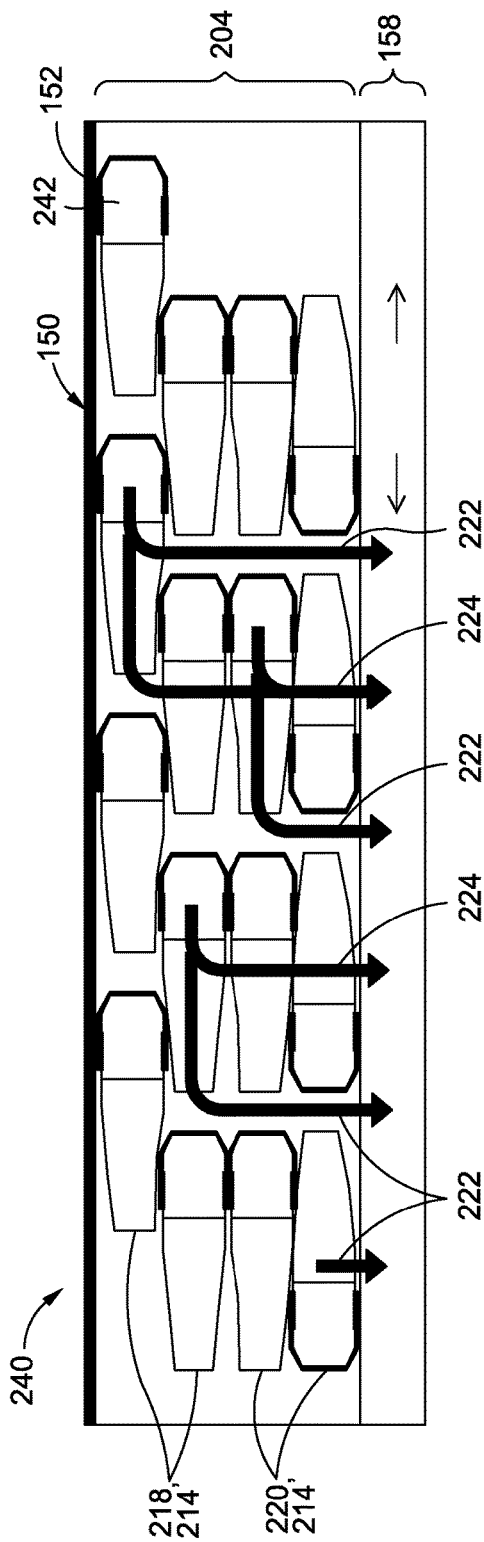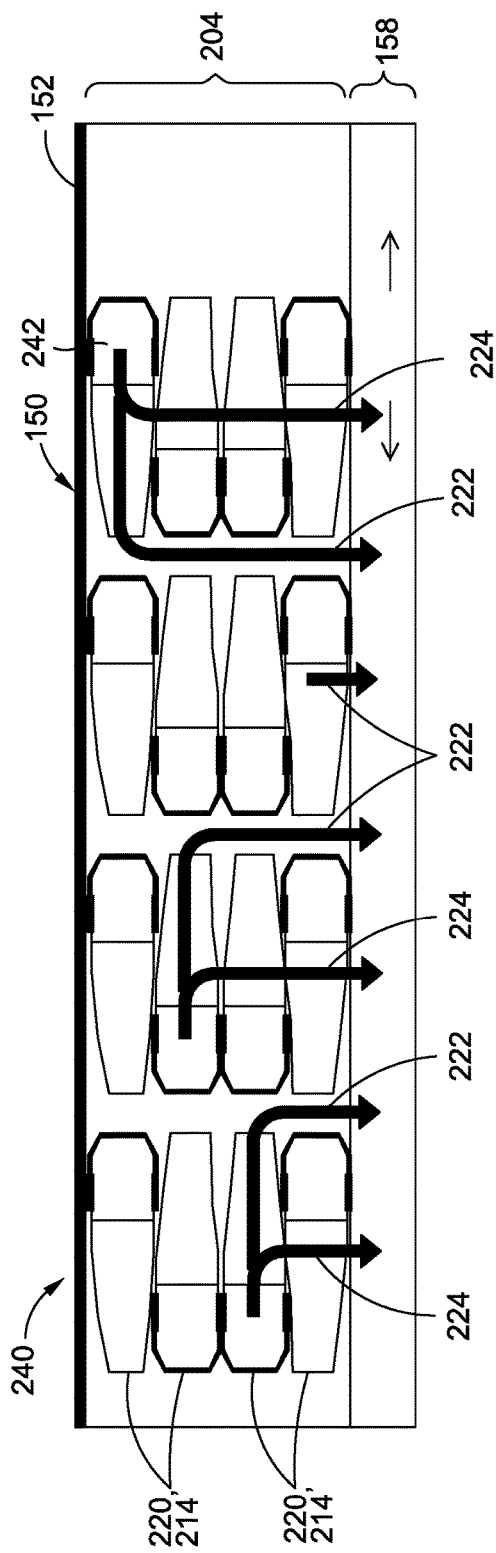

METHOD OF DETERMINING A SEATING ARRANGEMENT

CROSS-REFERENCE TO RELATED APPLICATIONS

The present application is a divisional application of and claims priority to pending U.S. application Ser. No. 14/278,907 filed on May 15, 2014, and entitled SEATING ARRANGEMENT AND METHOD, the entire contents of which is expressly incorporated by reference herein.

FIELD

The present disclosure relates generally to passenger seating arrangements and, more particularly, to seating arrangements for passenger seats such as in an aircraft cabin.

BACKGROUND

The design of an aircraft passenger seat and the layout of an aircraft cabin involves inherently conflicting requirements of providing space in each seat for the comfort of the passenger while also providing a high-density seating arrangement to maximize airline revenues. In this regard, it may be desirable for seats in an aircraft cabin to allow a passenger to work, eat, and/or relax during a day flight, and allow the passenger to sleep during a night flight. Preferably, an aircraft passenger seat provides each passenger with comfortable positions for such activities while meeting relevant safety standards.

Ideally, the cabin area may be used in the most space-efficient manner possible so as to maximize the seat width and legroom for each passenger, while allowing for direct, unimpeded egress capability from each seat to a main aisle of the cabin. In addition, it may be desirable for a seat design and cabin layout to be configurable for use in a wide variety of aircraft configurations currently being designed, manufactured, and/or sold.

In view of the foregoing, there exists a need in the art for a passenger seating arrangement that maximizes seat density and includes seats that provide for the comfort of passengers during day and night flights, and which allow for unimpeded access to an aisle.

SUMMARY

The above-noted needs associated with passenger seating are specifically addressed by the present disclosure which provides a seating arrangement which may be implemented in an aircraft or in other vehicular or non-vehicular applications. In one example, the seating arrangement may include a plurality of seats that may be convertible into a flat bed configuration. Each seat may have a seat centerline that may be oriented at a seat angle relative to a longitudinal axis of an aircraft cabin. Each seat may include a footrest that may be offset from the seat centerline of the seat.

Also disclosed is a seating arrangement having a plurality of seats arranged in columns and which may be incorporated into an aircraft cabin. Each seat may be convertible into a flat bed configuration having a seat bottom and a footrest that may be narrower than the seat bottom. Each seat may allow for direct, unimpeded access to an aisle when the adjacent seats are in the bed configuration. In at least one column of an inboard column set and/or an outboard column set, the seats may be reversed in direction and/or the seat may be staggered relative to the seats in an adjacent column and/or an across-aisle column.

Also disclosed is a method of determining a seating arrangement for an aircraft cabin. The method may include entering configuration parameters into a processor. The configuration parameters may include the cabin width, the quantity of aisles, the minimum aisle width, and the quantity of columns of seats. Each seat may be movable between a seated configuration and a bed configuration having a seat width that tapers from a main portion to a footrest. The method may additionally include entering seat parameters describing a taper in seat width from the main portion to the footrest. The method may also include entering configuration rules into the processor. The configuration rules may include that in at least one column of an inboard column set and/or an outboard column set, the seats are reversed in direction and/or are staggered. The method may further include determining, using the processor, a seating arrangement including a column quantity in each column set, and a seat direction and/or a stagger for each column in the seating arrangement that results in a maximum seat width at a main portion of the seats and a maximum seat density.

The features, functions and advantages that have been discussed can be achieved independently in various embodiments of the present disclosure or may be combined in yet other embodiments, further details of which can be seen with reference to the following description and drawings below.

BRIEF DESCRIPTION OF THE DRAWINGS

These and other features of the present disclosure will become more apparent upon reference to the drawings wherein like numbers refer to like parts throughout and wherein:

FIG. 4 is a side view taken along line 4 of FIG. 3 and illustrating a passenger seat in an upright seated configuration;

FIG. 5 is a side view of a seat of FIG. 4 converted into a flat bed configuration;

FIG. 6 is a plan view of an example of a seating arrangement for a single-aisle aircraft cabin wherein the seats are arranged in a pair of outboard column sets and wherein one of the outboard column sets contains two columns and the other outboard column set contains three columns;

FIG. 7 is a plan view of an example of a seating arrangement for a single-aisle aircraft cabin wherein each one of the outboard column sets contains three columns;

FIG. 9 is a side view of a pair of seats in a column taken along line 9 of FIG. 8 and illustrating the path width of a primary egress path between the footrest of one seat and the seatback of a forward seat;

FIG. 10 is a forward-looking view of the cabin taken along line 10 of FIG. 8 and illustrating a pair of seats separated by an aisle and illustrating different minimum aisle width requirements at different heights above the cabin floor;

FIGS. 12A-12F illustrate examples of seating arrangements for a 9-column twin-aisle aircraft cabin having a 2-5-2 column-aisle configuration;

FIGS. 13A-13F illustrate examples of seating arrangements for a 9-column twin-aisle aircraft cabin having a 2-4-3 column-aisle configuration;

FIGS. 14A-14F illustrate examples of seating arrangements for a 9-column twin-aisle aircraft cabin having a 3-3-3 column-aisle configuration;

FIGS. 15A-15F illustrate examples of seating arrangements for a 10-column twin-aisle aircraft cabin having a 3-4-3 column-aisle configuration;

FIGS. 16A-16F illustrate examples of seating arrangements for a 10-column twin-aisle aircraft cabin having a 2-4-4 column-aisle configuration;

FIGS. 17A-17F illustrate examples of seating arrangements for a 10-column twin-aisle aircraft cabin having a 2-5-3 column-aisle configuration;

FIGS. 18A-18F illustrate examples of seating arrangements for a 10-column twin-aisle aircraft cabin having a 2-6-2 column-aisle configuration;

FIGS. 19A-19B illustrate examples of seating arrangements for a 12-column triple-aisle aircraft cabin having a 3-3-3-3 column-aisle configuration;

FIGS. 20A-20F illustrate examples of seating arrangements for an outboard column set having 4 columns;

DETAILED DESCRIPTION

Figure 1:
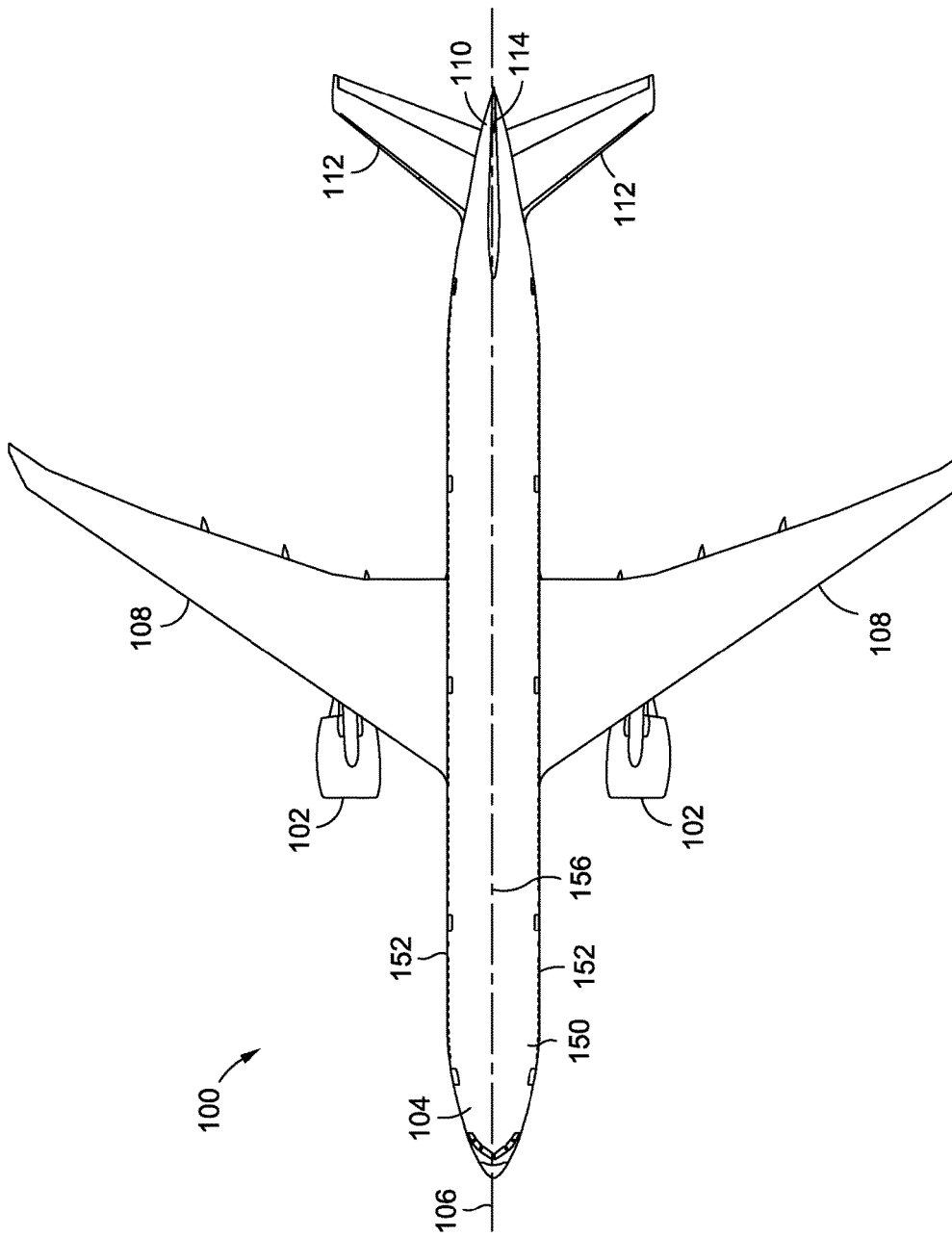
FIG. 1 is a top view of an aircraft.

Referring now to the drawings wherein the showings are for purposes of illustrating various embodiments of the disclosure, shown in FIG. 1 is a plan view of an aircraft 100 that may include one or more embodiments of a seating arrangement 240 as disclosed herein. In the present disclosure, a seating arrangement 240 may be described as the relative location and orientation of seats 242, columns 200, and aisles 158 within the aircraft cabin 150. The various examples of seating arrangements 240 disclosed herein provide improved seat density for an aircraft cabin 150 with full, flat bed capability for each seat 242 and direct, unimpeded access to an aisle 158 from each seat 242. In any of the embodiments disclosed herein, an aircraft cabin 150 may include one or more different seating arrangements 240 at different locations along the cabin length 170 of the aircraft cabin 150. For example, an aircraft 100 may include a first class section (not shown) having one type of seating arrangement 240, and a business class section (not shown) having a seating arrangement 240 that is different than the seating arrangement 240 in the first class section.

In FIG. 1, the aircraft 100 may include a fuselage 104 having a longitudinal axis 156 or centerline that may extend lengthwise along the fuselage 104. The fuselage 104 may include a nose defining a forward 106 direction of the aircraft 100. The aircraft 100 may include an aircraft cabin 150 having opposing sidewalls 152 on opposite sides of the fuselage 104. The aircraft cabin 150 may contain a plurality of seats 242 that may be arranged in a seating arrangement 240 as disclosed herein. A pair of wings 108 may be attached to the fuselage 104. The aircraft 100 may include one or more propulsion units 102 which may be mounted to the wings 108 or at other locations on the aircraft 100. The aircraft 100 may include an empennage 110 at the aft end of the fuselage 104 and which may include a horizontal tail 112 and a vertical tail 114 for directional control of the aircraft 100.

Although the various seating arrangements 240 of the present disclosure are described in the context of a tube-and-wing aircraft 100 as shown in FIG. 1, any one or more of the seating arrangements 240 disclosed herein may be incorporated into any aircraft configuration, without limitation. For example, any one of the seating arrangements 240 disclosed herein may be incorporated into a blended-wing-body aircraft or in any other aircraft configuration. In addition, any one of the seating arrangements 240 disclosed herein may be incorporated into other vehicular applications including, but not limited to, any marine, land, air, and/or space vehicle. In addition, any one of the seating arrangements 240 disclosed herein may be implemented in any vehicular application or non-vehicular application, without limitation, and are not limited to incorporation into an aircraft cabin 150.

Figure 2:
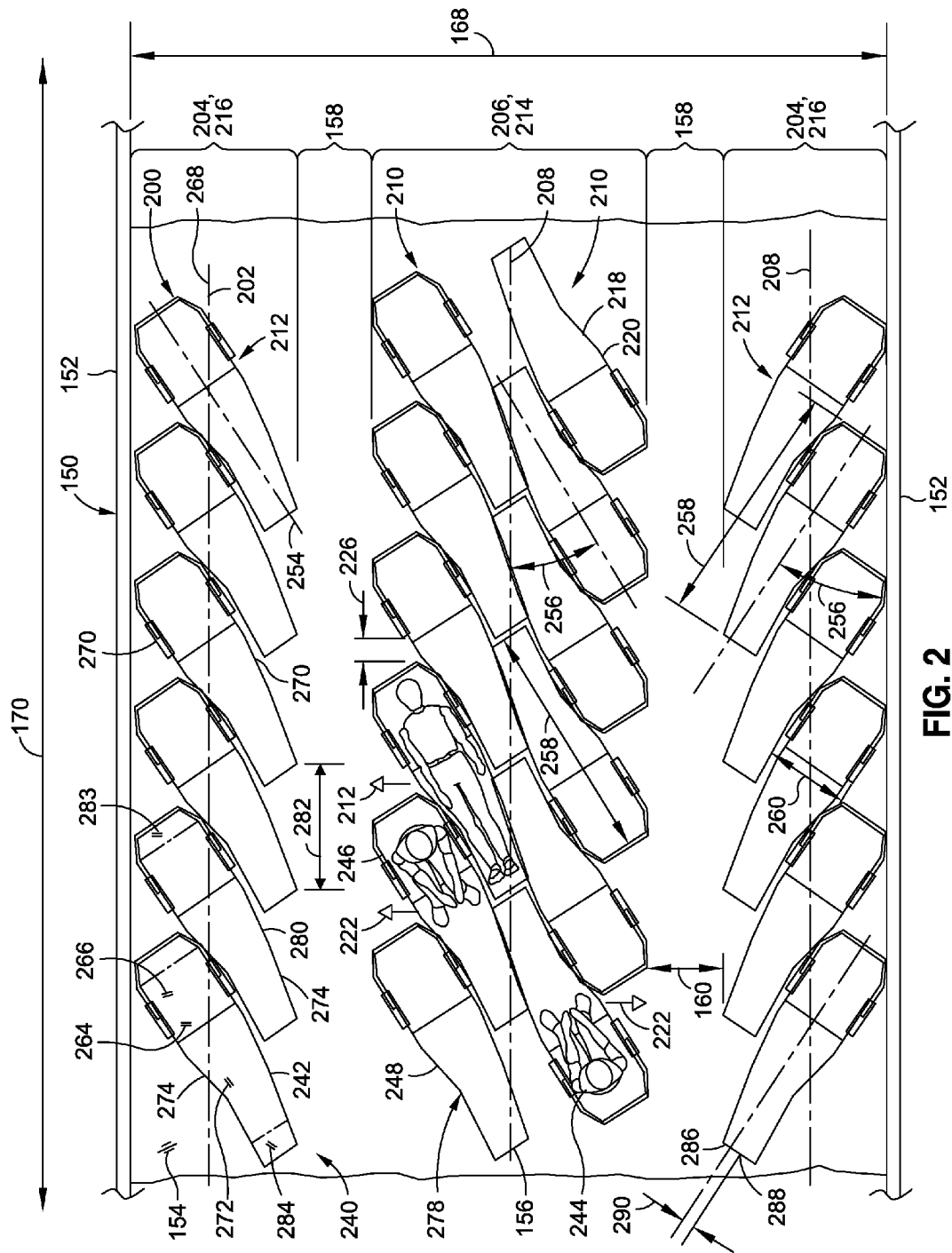
FIG. 2 is a plan view of an example of a seating arrangement for an aircraft cabin including seats that are convertible from an upright seated configuration into a flat bed configuration and wherein each seat may be oriented at an angle relative to a longitudinal axis of the aircraft cabin.

FIG. 2 shows an example of a seating arrangement 240 for an aircraft cabin 150. The seating arrangement 240 includes a plurality of seats 242, any one or more of which may have the attributes of being convertible between an upright seated configuration 246 and a flat bed configuration 248, and allowing for direct, unimpeded access to an aisle 158 when the adjacent seats 242 are in the bed configuration 248, as described in greater detail below. For example, FIG. 2 shows an embodiment of a seating arrangement 240 wherein each one of the seats 242 is convertible between a seated configuration 246 and a bed configuration 248. In some examples, the seats 242 in the bed configuration 248 may have a substantially horizontal lie-flat capability. However, in other examples not shown, one or more of the seats 242 in the bed configuration 248 may be slightly inclined relative to horizontal.

The seats 242 may be arranged in one or more columns 200. A column 200 may be described as a set of seats 242 arranged in longitudinal alignment with one another. Each column 200 has a column axis 202. Although FIG. 2 illustrates the column axes 202 oriented substantially parallel to one another and substantially parallel to the longitudinal axes of the aircraft cabin 150, a seating arrangement 240 may be provided wherein the column axis 202 of one or more columns 200 is oriented non-parallel to the longitudinal axis 156 of the aircraft cabin 150.

A seating arrangement 240 may include one or more column sets 204, 206. A column set 204, 206 may include a single column 200, or a column set 204, 206 may include two or more columns 200. The columns 200 in a multi-column set 204, 206 are located directly adjacent to one another with no aisle 158 between the columns 200. For example, the seats 242 in one column 200 of a column set 204, 206 may be located immediately adjacent to the seats 242 in the adjacent column 214 of the same column set 204, 206. In one example, the seat sides 274 of the seats 242 in one column 200 of a column set 204, 206 may be located at a maximum distance of less than approximately 6 inches from the seat sides 274 of the seats 242 of an adjacent column 214 of the same column set 204, 206 for any location along the length of the adjacent seats 242. More preferably, the seat sides 274 of the seats 242 in immediately adjacent columns 200 may be spaced apart at less than approximately 3 inches side-to-side. In other embodiments, the seat sides 274 of the seats 242 in adjacent columns 200 of a column set 204, 206 may be positioned in contacting relation to one another in least one location along a seat side 274 of the least one of the adjacent pairs of seats 242. In still other embodiments, an adjacent pair of seats may be formed as a unitary assembly (not shown), as described below.

FIG. 2 illustrates a seating arrangement 240 having a pair of outboard column sets 204 located on opposite sides of the aircraft cabin 150, and an inboard column set 206 located between the pair of outboard column sets 204. Each one of the outboard column sets 204 is separated from the inboard column set 206 by a longitudinally-extending aisle 158. A column set with a sidewall 152 on one side of the column set may be referred to as an outboard column set 204. A column set with an aisle 158 on both sides of the column set may be referred to as an inboard column set 206.

An aircraft cabin 150 may include one or more aisles 158 extending in a generally forward/aft direction of the aircraft cabin 150. In this regard, an aircraft 100 may be classified by the number of aisles 158 in the aircraft cabin 150. For example, a tube-and-wing aircraft 100 (e.g., see FIG. 1) having one aisle 158 in each zone or section (e.g., in the economy class section, the business class section, the first class section) may be described as a single-aisle aircraft, a tube-and-wing aircraft 100 having two aisles 158 in each section may be described as a twin-aisle aircraft, and a tube-and-wing aircraft 100 having three aisles 158 in each section may be described as a triple-aisle aircraft. A single-aisle aircraft 100 may include only two column sets. A twin-aisle aircraft 100 may include only three column sets including a pair of outboard column sets 204 and an inboard column set 206. A blended-wing aircraft (not shown) may have a combination of single-aisle sections, twin-aisle sections, or other multi-aisle sections. For example, the cabin of a blended-wing aircraft may have a single-aisle section in the first class section, and the remainder of the cabin of the blended-wing aircraft may be a combination of twin-aisle and triple-aisle sections, or any one of a variety of other combinations of single-aisle or multi-aisle sections.

In FIG. 2, each one of the outboard column sets 204 has a single column 200 of seats 242 forming a sidewall column 212. Each sidewall column 212 is bounded by the aircraft cabin 150 sidewall 152 on one side of the sidewall column 212, and an aisle 158 on an opposite side of the sidewall column 212. However, an outboard column set 204 may include two or more columns 200, at least one of which is a sidewall column 212. The seating arrangement 240 in FIG. 2 further includes a single inboard column set 206 containing two columns 200 directly adjacent to one another and are not longitudinally aligned with one another. The two columns 200 are directly adjacent to one another in the sense that the seats 242 in one column 200 are in close proximity to or in contact with the seats 242 in the adjacent column 200 with no aisle between the columns 200. The seats 242 in one of the columns 200 of the inboard column set 206 are longitudinally offset relative to the seats 242 in the adjacent column 200. In addition, the seats 242 in one of the columns of the inboard column set 206 may be reversed in direction relative to the seats 242 in the adjacent column 200 as shown. Although FIG. 2 illustrates the inboard column set 206 containing two (2) columns 200, an aircraft cabin 150 may have an inboard column set 206 may include three or more columns 200. In some examples, an inboard column set 206 may include a single column 200.

In the present disclosure, the number of columns 200 and aisles 158 in a given seating arrangement 240 may be specified in a shorthand manner by specifying the quantity of columns 200 in each column set 204, 206 separated by a dash ("-"). The dash ("-") represents an aisle 158. The aisle-column configuration of a given seating arrangement 240 may be specified from one side of the cabin 150 to the opposite side of the cabin. For example, the aisle-column configuration of a seating arrangement 240 may be specified from the right-hand side of the aircraft cabin 150 to the left-hand side of the aircraft cabin 150 when facing the front of the aircraft cabin 150. In FIG. 2, the seating arrangement 240 may be specified as 1-3-1, indicating that from the right-hand side to the left-hand side of the aircraft cabin 150, there is one (1) column 200 in the right-hand outboard column set 204, then an aisle 158, then three (3) columns 200 in the inboard column set 206, then an aisle 158, then one (1) column 200 in the left-hand outboard column set 204. In another example, the seating arrangement 240 shown in FIG. 6 (described in greater detail below) may be specified as 3-3, indicating that the right-hand outboard column set 204 includes three (3) columns 200 and the left-hand outboard column set 204 includes three (3) columns 200. The seating arrangement 240 shown in FIG. 7 (described in greater detail below) may be specified as 3-2, indicating that the right-hand outboard column set 204 includes three (3) columns 200 and the left-hand outboard column set 204 includes two (2) columns 200.

In FIG. 2, each seat 242 may be oriented at an angle 256 relative to the longitudinal axis 156 of the aircraft cabin 150. More particularly, each seat 242 may have a seat centerline 254 that may be oriented at an angle 256 relative to the column axis 202 of the column 200 containing the seat 242. In the present disclosure, the seat centerline 254 of a seat 242 may be described as being located midway between the opposing seat sides 274 in the region of the seat bottom 264. The seat centerline 254 may extend in a straight line along the seat length 258. The seat length 258 may be described as the overall length of the seat 242 in the bed configuration 248. The overall length of the seat 242 may be defined as the maximum external length of the seat 242 from the edge of the footrest 284 to an opposite end of the seat 242, as shown in FIG. 5.

In some examples, the seats 242 in a column 200 may be oriented at an angle 256 within the range of approximately +/−45 degrees or more relative to the longitudinal axis 156 of the aircraft cabin 150. For example, in FIG. 2, the seat centerlines 254 of the seats 242 in at least one of the outboard column sets 204 and/or the inboard column sets 206 may be oriented at an angle 256 of approximately +/−30-35 degrees relative to the longitudinal axis 156 of the aircraft cabin 150. In FIG. 2, the seats 242 in the outboard column sets 204 may be oriented at an angle 256 of approximately +/−34 degrees relative to the longitudinal axis 156, and the seats 242 in the inboard column set 206 may be oriented at an angle 256 of approximately +/−32 degrees relative to the longitudinal axis 156. However, the seat centerlines 254 may be oriented at any angle 256 relative to the longitudinal axis 156 of the aircraft cabin 150. In some embodiments, the seat centerlines 254 of the seats 242 in a column 200 may be parallel to one another, as shown in FIG. 2. However, the seat centerlines 254 of one or more of the seats 242 in a given column 200 may be oriented at a slight angle 256 relative to one another. For example, the seat centerlines 254 of the seats 242 in a given column 200 may be parallel to one another within a tolerance band such as within approximately 10 degrees.

In FIG. 2, the seats 242 in the sidewall column 212 on one side of the aircraft cabin 150 are shown in mirror image with regard to configuration and angular orientation relative to the seats 242 in the sidewall column 212 on the opposite side of the aircraft cabin 150. However, the seating arrangement 240 may be configured such that the seats 242 in an opposing pair of sidewall columns 212 have the same configuration and angular orientation (i.e., non-mirror-image). In any one of the embodiments disclosed herein, each one of the seats 242 may have substantially the same size and shape when viewed from above. In this regard, each one of the seats 242 in the seating arrangement 240 may have substantially the same size and footprint on the cabin floor 154 when the seating arrangement is viewed from above. For example, when the seats 242 are in the bed configuration 248, all the seats 242 may have substantially the same size and shape. However, in some embodiments, the bed configuration 248 of some of the seats 242 may have a different size and shape (e.g., footprint) than the bed configuration 248 of other seats 242. For example, in FIG. 2, the seats 242 in one of the outboard column sets 204 may have the same size and shape as the seats 242 in the other outboard column sets 204. However, the seats 242 in one of the outboard column sets 204 may be configured in mirror image about the seat centerline 254 in the other outboard column set 204.

Figure 3:
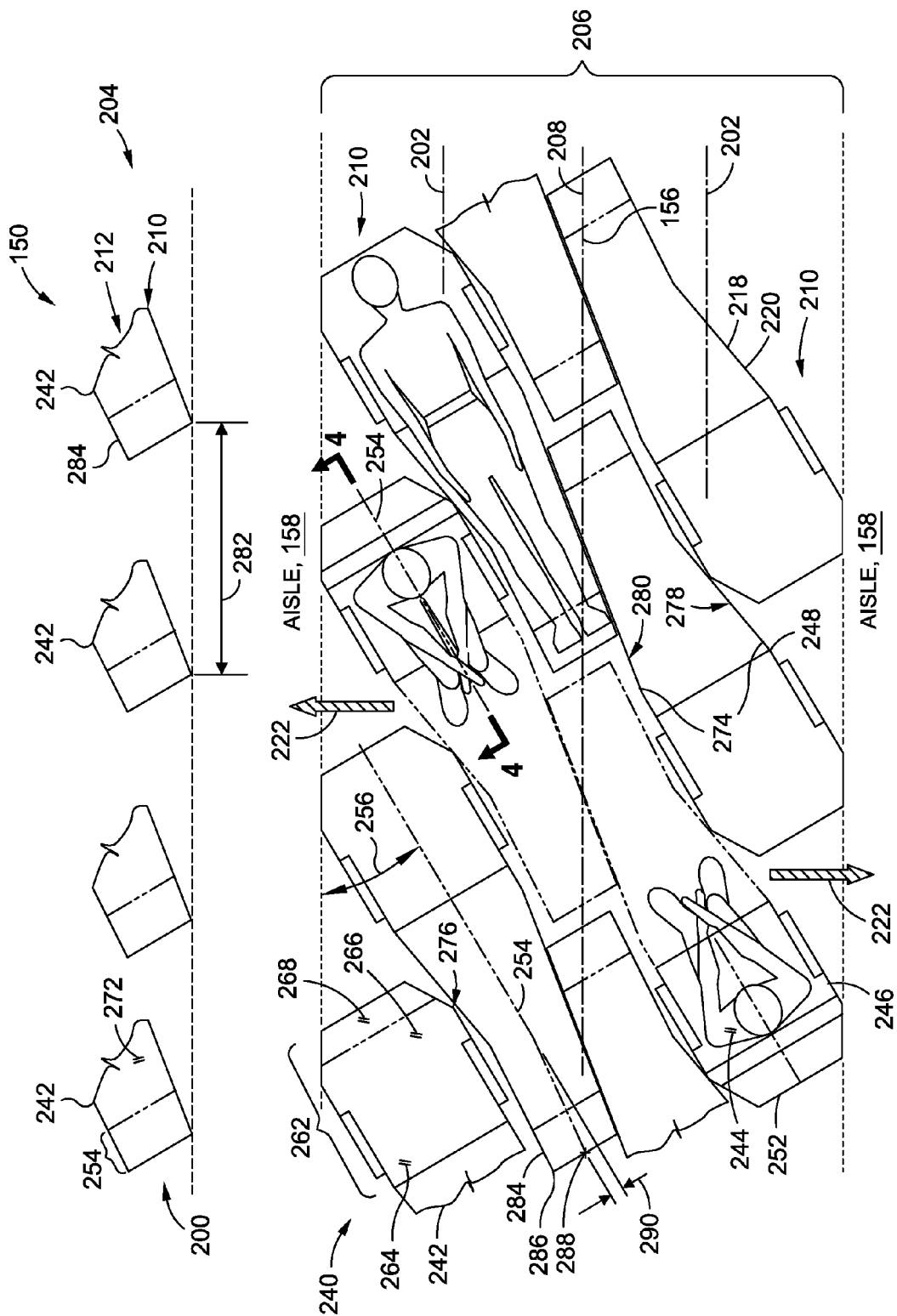
FIG. 3 is an enlarged view of a portion of the seating arrangement of FIG. 2 and illustrating each seat allowing for direct, unimpeded access to an aisle of the aircraft cabin.

Referring to FIG. 3, each seat 242 may have a seat width 260 that may be non-uniform along the seat length 258. For example, each one of the seats 242 may be tapered in seat width 260 along a direction from the seat bottom 264 to the footrest 284 such as when the seat 242 is in the bed configuration 248. In the present disclosure, the seat width 260 may be described as the external width of the seat 242 at a given location along the seat length 258, and may be measured from one seat side 274 to an opposite seat side 274 of the seat 242. In addition, each seat 242 may have a footrest 284. In some examples, the footrest 284 may have a length of no more than approximately 25 percent of the seat length 258 of the seat 242. However, the footrest 284 may have a length greater than 25 percent of the seat length 258. The seat 242 may have a maximum external seat width 260 at the seat bottom 264 and a footrest 284 width at a footrest end 286 of the footrest 284.

The footrest end 286 of the seat 242 may be narrower than the maximum external seat width 260. In some examples, the footrest end 286 may be narrower than the maximum external seat width 260 by at least 30 percent. In some embodiments, the maximum external seat width 260 may be in the range of from approximately 20-35 inches. The width at the footrest 284 may be in the range of approximately 5-20 inches or more. In some examples, the footrest 284 may have a width of approximately 8-16 inches. For example, the footrest 284 may have a width of approximately 12 inches. The seat bottom 264 may have a substantially constant seat width 260, although the seat bottom 264 may be tapered in width. In some examples, the seat 242 may be described as having a main portion 262 when the seat 242 is in the bed configuration 248. The main portion 262 may include the seat bottom 264, the seat back 266, and/or the headrest 268. The specific seat 242 designs may have any one of a variety of different configurations and are not limited to the arrangements shown in FIGS. 4-5. For example, any one of the seats 242 may include a variety of fixed or articulated assemblies, including, but not limited to side privacy screens, footrest 284 covers, personal stowage areas, and other features.

In the embodiment shown in FIG. 3, the seat width 260 may be tapered from an end of the seat bottom 264 toward a footrest end 286 of the footrest 284. In this regard, the seat width 260 may be tapered in the area of the leg rest 272 and the footrest 284. In addition, when the seat 242 is in the bed configuration 248, the area of the seat back 266 and headrest 268 may be chamfered or rounded. The maximum external seat width 260 may generally occur in the area of the seat bottom 264. However, the seat 242 may be provided in any one of a variety of different tapered configurations and is not limited to that which is described herein and/or illustrated in the figures.

In FIG. 3, the footrest 284 of one or more of the seats 242 may be transversely offset 290 from the seat centerline 254. In this regard, the footrest end 286 may have a footrest center 288 that may be offset 290 from the seat centerline 254 when the seat 242 is in the bed configuration 248. The footrest center 288 may be described as lying along the footrest end 286 and/or being located midway between the opposing lateral sides of the footrest 284. The footrest center 288 may be offset 290 from the seat centerline 254 by approximately 2-8 inches. For example, the footrest center 288 may be offset 290 from the seat centerline 254 by approximately 4 inches.

In some embodiments, the footrest 284 and/or at least a portion of the leg rest 272 of one or more seats 242 may be non-symmetrical about the seat centerline 254. In addition, other portions of a seat 242 may be non-symmetrical about the seat centerline 254 when the seat 242 is in the bed configuration 248. For example, as shown in FIGS. 4-5 and described in greater detail below, a seat 242 may include a headrest 268, a seat back 266, a seat bottom 264, a leg rest 272, and a footrest 284, any combination of which may be used to form the seat 242 in the bed configuration 248, and which may be non-symmetrical about the seat centerline 254.

In FIG. 3, one or more of the seats 242 may include a bulge shape or a convex shape 280 on one of the seat sides 274. One or more of the seats 242 may include a notch shape or a concave shape 278 on one of the seat sides 274. In some examples, a seat 242 may have a convex shape 280 on one seat side 274, and a concave shape 278 on an opposite seat side 274 of the seat 242. An offset 290 of the footrest 284 of a seat 242 may contribute to the concave shape 278 and/or convex shape 280 of the seat side 274. In FIG. 3, the seats 242 in one of the columns 200 may be angled relative to the column axis 202. For example, the footrest 284 of the seats 242 in one of the columns 200 may be positioned at an approximate midpoint 276 of the nearest seat 242 forward or aft in the same column 200. In addition, the seats 242 in a column 200 of a column set 204, 206 may be reversed 220 such that the seat 242 in one of the columns 200 faces in a direction opposite the seats 242 of an adjacent column 214. Furthermore, the seats 242 in one column 200 of a column set 204, 206 may be staggered 218 in a longitudinal direction relative to the seats 242 in an adjacent column of the same column set 204, 206. For example, the seats 242 in one column 200 may be longitudinally staggered 218 relative to the seats 242 in another column 200 by an amount equal to one-half of the seat pitch 282 between the seats 242. As described below, seat pitch 282 may be described as the longitudinal distance from a point (e.g., an end or corner of the seat) on one seat 242 in a column 200 to the same point on the next seat 242 forward 106 in the same column 200 and/or the next seat 242 aft in the same column 200.

FIG. 3 illustrates a seating arrangement 240 wherein the seats 242 are arranged in an inboard column set 206 and a pair of outboard column sets 204. Each one of the outboard column sets 204 is separated from the inboard column set 206 by an aisle 158. The inboard column set 206 may include two columns 200 having a column set centerline 208. The footrests 284 of each seat 242 in the two columns 200 of the inboard column set 206 may be located adjacent to the column set centerline 208. In addition, the footrest 284 of the seats 242 in one of the columns 200 may be positioned at an approximate midpoint 276 of the seat 242 in the adjacent column 214 of the column 200 set. Advantageously, the convex shape 280 of the seat sides 274 of the seats 242 in one column 200 may be tightly nested with the concave shape 278 of the seat sides 274 of the respective adjacent seats 242 in the adjacent column 214 of the column 200 set. In the example shown, the footrest 284 of the seat 242 in one column 200 face the footrest 284 of a seat 242 of in the adjacent column 214.

As shown in FIG. 3, the seat sides 274 of the seats 242 in each column 200 of a column set may be positioned in close relation (e.g., within 1-3 inches) or contacting relation to the seat sides 274 of the seat 242 in the immediately adjacent column 214 of the column set along at least one location of the seat length 258. The nesting of the seats 242 and the staggered 218 placement of the seats 242 in the adjacent columns 200 may advantageously reduce the total width of the column set. In an embodiment not shown, two or more seats 242 in a seat column 200 may be formed as a unitary assembly (not shown) or are interconnected by common parts such that the seats 242 of the unitary assembly are in continuous contact with one another and may be installed in the aircraft cabin 150 as a unit.

In an embodiment not shown, two or more seats 242 of adjacent seat columns may be formed as a unitary assembly (not shown) such that the seats 242 of the adjacent columns 200. Although not shown, such a unitary assembly of seats 242 may include a privacy shield (not shown) to block the footrest 284 of each seat 242 from the field of view of the other seat(s) in the unitary assembly or from the field of view of adjacent seats 242 that are unattached to the unitary assembly. In still further embodiments not shown, a unitary assembly may include a combination of seats 242 in the same column 200 and seats 242 in different columns 200. Regardless of whether the seats 242 are provided as individual units or the seats 242 are provided in a unitary assembly, the seats 242 may be nested together as shown in FIG. 3 to reduce the total width of the column set. The reduction in the total width of the column set may advantageously allow for an increase in the seat width 260 of the individual seats 242 in each column 200 relative to the seat width provided by a seating arrangement containing seats 242 that are symmetric (not shown) about the seat centerline 254 and/or that are non-tapered (not shown) along the seat length 258.

The seating arrangement 240 may allow for maximized seat width 260 while maintaining a minimum aisle width 160 (FIG. 10) as may be required by an aviation regulatory body such as the Federal Aviation Administration (FAA) or foreign equivalent, and/or as may be specified by the design requirements of a manufacturer or a customer. For example, a manufacturer may specify a minimum aisle width 160 that may slightly wider than the minimum aisle width 160 specified by an aviation regulatory body such as the FAA. In some examples, the seating arrangement 240 may take advantage of the different minimum aisle widths 160 above and below an aisle threshold height 162 measured from the cabin floor 154. For example, for aircraft 100 having a seating capacity of 20 or more passengers, the FAA require a first minimum aisle width 164 (FIG. 10) of equal to or greater than 20 inches at any point between seats 242 for an aisle threshold height 162 of equal or greater than 25 inches above the cabin floor 154. At an aisle threshold height 162 of less than 25 inches above the cabin floor 154, a second minimum aisle width 166 (FIG. 10) at any point between seats 242 must equal or exceed 15 inches. The minimum aisle width 160 may be described as the width of the aisle 158 at the shortest distance between two across-aisle seats. Alternatively, the minimum aisle width 160 may be described as the width of the aisle 158 when viewed from one end of the aisle 158.

In some embodiments, the seating arrangements 240 described in the present disclosure may be configured to take advantage of the above-noted difference in the minimum aisle width 160 above and below the aisle threshold height 162 as a means to maximize the seat widths 260. For example, by angling the seats 242 in one or more of the aisle columns 210 (e.g., see FIG. 2) and/or by configuring the seats 242 in one or more of the aisle columns 210 such that the tapered portions of the seats 242 (e.g., the footrests 284) are near the aisle 158 (e.g., see FIG. 2) and have a height of less than 25 inches when placed in the bed configuration 248, the aisle width 160 may be reduced relative to the aisle width for seating arrangements having non-angled (not shown) and/or non-tapered seats (not shown). In this regard, the ability to use a reduced aisle width 160 (e.g., a second minimum aisle width 166) may allow for an increase in the maximum seat width 260 of each seat 242 (e.g., at the seat bottom 264 portion). In addition, by staggering the cross-aisle columns 210 such that the footrest 284 of the seats 242 in one aisle column 210 are longitudinally positioned directly across from the main portion 262 (e.g., the seat bottom 264) of the aisle 158 in the other aisle column 210, the smaller second minimum aisle width 166 (e.g., 15 inches) may be used instead of the larger first minimum aisle width 164 (e.g., 20 inches). The ability to use the smaller second aisle width 160 in an angled seat arrangement may allow for an increase in the maximum seat width 260 of each seat 242 in the seating arrangement 240 due to the seats 242 being oriented at an angle as shown in FIGS. 2-3.

As shown in FIG. 3, the seating arrangement 240 allows for direct, unimpeded access from each seat 242 to an aisle 158 of the aircraft cabin 150. In this regard, each passenger 244 may have direct access from their seat 242 to the main aisle 158 of the aircraft cabin 150 via at least one egress path 222 which also serves as the ingress path to the seat 242. For seats 242 located in an aisle column 210, the passenger 244 may exit directly into the aisle 158. In some embodiments, the egress path 222 may be oriented primarily in a transverse direction. In this regard, the egress path 222 may be oriented generally perpendicular to the forward 106 direction of the aircraft 100 and/or perpendicular to the aisle 158. However, one or more portions of the egress path 222 may be oriented non-perpendicularly relative to the forward 106 direction and/or relative to the aisle 158. In the seating arrangement 240 shown in FIGS. 2-3, each seat 242 may have a primary egress path 222 allowing for direct unimpeded access from the seat 242 to the aisle 158. In other seating arrangements 240 described below (e.g., see FIGS. 6-8 and 11-20) wherein the seats 242 may be generally non-angled relative to the column axis 202, each seat 242 may include a primary egress path 222 and a secondary egress path 224. The secondary egress path 224 may allow for direct unimpeded access to the aisle 158 when the adjacent seats 242 are in the seated configuration 246. For example, when the seats 242 are arranged in staggered 218 columns, a secondary egress path 224 may allow a passenger 244 to exit their seat 242 through an area of the cabin 150 formerly occupied by adjacent seats 242 in the bed configuration 248.

The seating arrangements 240 disclosed herein may be configured such that a passenger 244 may access a main aisle 158 from their seat 242 using the primary egress path 222 without stepping over seats 242 or disturbing other passengers 244, regardless of whether the adjacent seats 242 are in the seated configuration 246 or in the bed configuration 248. In this regard, the seating arrangements 240 are configured such that none of the adjacent seats 242 block or obstruct the primary egress path 222 for any seat 242. In some examples where the seats 242 in a column 200 are staggered 218 relative to an immediately adjacent column 214, a passenger 244 may exit their seat 242 by first retracting their seat 242 from the bed configuration 248 into the seated configuration 246, and then proceeding longitudinally forwardly or aftwardly from their seat 242, and then turning and moving transversely toward the main aisle 158 via the primary egress path 222. In other examples, the passenger 244 may exit their seat 242 while the seat 242 is in the bed configuration 248. The primary egress paths 222 may each have a path width 226 (FIG. 9) that allows a passenger 244 to walk on the cabin floor 154 from their seat 242 to the main aisle 158 without being impeded by any portion of any seat whether in the seated configuration 246 or in the bed configuration 248. Each primary egress path 222 may have a path width 226 in the range of from approximately 10-15 inches or more. In some examples, retraction of a seat 242 from the bed configuration 248 to the seated configuration 246 may include retracting the footrest 284 to the passenger's seat 242 or retracting the footrest 284 into an adjacent seat.

The seats 242 in each column 200 may be located at a seat pitch 282 that provides a minimum path width 226 for all of the primary egress paths 222, while maximizing seat density in the aircraft cabin 150. The seat pitch 282 may be described as the longitudinal distance from a point on one seat 242 in a column 200 to the same point on the next seat 242 forward or aft in the same column 200. In the angled seating arrangement shown in FIGS. 2-3, the seats 242 in one or more of the columns 200 may have a seat pitch 282 of between approximately 30-50 inches or more. In the non-angled seating arrangements shown in FIGS. 6-8 and 11-20, the seat pitch 282 in one or more columns 200 may be in the range of between approximately to 70-100 inches, and more preferably between 88-90 inches. In any one of the seating arrangements disclosed herein, the seat pitch 282 for the columns 200 in each column 200 set may be substantially constant. However, the seat pitch 282 may be different for different column sets 204, 206. For example, the constant seat pitch 282 in an outboard column set 204 may be different than the constant seat pitch 282 in an inboard column set 206 or different than the constant seat pitch 282 in another outboard column set 204. In any of the seating arrangements 240 disclosed herein, the seat pitch 282 may be long enough to provide the minimum desired path width 226 for the primary egress paths 222 for each seat 242.

In FIGS. 4-5, shown is an example of a passenger seat 242. FIG. 4 illustrates the seat 242 in an upright seated configuration 246. FIG. 5 illustrates the seat 242 in a flat bed configuration 248. In the example shown, the seat length 258 may include a head rest 268, the seat back 266, a seat bottom 264, a leg rest 272, and a footrest 284. The seat 242 may optionally include one or more arm rests 270 that may extend outwardly when the seat 242 is in the upright seated configuration 246 as shown in FIG. 4, and may be folded along side the seat 242 when the seat 242 is in the bed configuration 248 as shown in FIG. 5. The specific seat designs may have any one of a variety of different configurations and are not limited to the arrangements shown in FIGS. 4-5. For example, any one of the seats 242 may include a variety of fixed or articulated assemblies, including, but not limited to side privacy screens, footrest covers, personal stowage areas, and other features.

It should be noted that for some seat embodiments, the footrest 284 that is deployed from the seat 242 when the seat 242 is moved from the seated configuration 246 to the bed configuration 248. For example, FIG. 4 illustrates a seat 242 in the upright configuration having a leg rest 272 and a footrest 284 folded underneath the seat bottom 264. FIG. 5 illustrates the deployment of the leg rest 272 and footrest 284 when the seat 242 is moved into the bed configuration 248. However, in other seat embodiments not shown, the footrest 284 for a given seat 242 may be part of an adjacent seat 242 and may be deployed outwardly from the adjacent seat 242 to serve as the footrest 284 for the given seat 242 when the given seat 242 is moved into the bed configuration 248. In embodiments where the footrest 284 is deployed from an adjacent seat, the seating arrangement 240 is such that direct, unimpeded access is provided from the seat 242 to the main aisle 158 regardless of whether the footrest 284 from the adjacent seat 242 is deployed or retracted.

The seats 242 may be provided in any seat length 258 when the seat 242 is in the bed configuration 248. In one embodiment, a seat 242 may have a seat length 258 in the range of from approximately 60-90 inches when the seat 242 is in the bed configuration 248, and more preferably in the range of approximately 70-80 inches when the seat 242 is in the bed configuration 248. A seat 242 may be supported by a seat base 250. The seat base 250 may be coupled to the cabin floor 154. For example, the seat base 250 may be coupled to one or more seat tracks (not shown) that may be integrated into the cabin floor 154. In addition, the seat 242 may include a seat back 266 that may function as a privacy shield 252 when the seat 242 is in the bed configuration 248. As indicated above, the seats 242 may additionally include any one of a variety of fixed structures and/or articulated assemblies, any one or all of which may be encompassed in the footprint of each seat 242 for purposes of determining a seating arrangement 240 that maximizes individual seat width 260 while also maximizing seat 242 density in the aircraft cabin 150.

In FIGS. 6-20F, shown are additional embodiments of seating arrangements 240 which may be installed in an aircraft cabin 150 and which may incorporate any one or more of the parameters, geometric aspects, spacings, orientations, attributes, features, and configurations of the seats 242 and/or seating arrangements 240 described above. FIGS. 6-7 illustrate different embodiments of single-aisle seating arrangements 240. FIGS. 12A-18F illustrate several examples of different embodiments of twin-aisle seating arrangements 240. FIGS. 19A-19B illustrate several examples of different embodiments of triple-aisle seating arrangements 240. FIGS. 20A-20F illustrate several examples of outboard column set 204 containing four (4) columns 200 of seats 242.

In FIGS. 6-20F, each seating arrangement 240 includes a plurality of seats 242 arranged in columns 200 and being convertible into a flat bed configuration 248 having a seat bottom 264 and a footrest 284 narrower than the seat bottom 264. The seat centerline 254 of each seat 242 may be oriented substantially parallel to the longitudinal axis 156 of the aircraft cabin 150. However, in some embodiments, the seat centerlines 254 may be oriented at a slight angle 256 (e.g., +/−10 degrees or more) relative to the longitudinal axis 156. The seat centerline 254 of each one of the seats 242 may be oriented substantially parallel to a column axis 202 of the column 200 containing the seat. In addition, the seat centerline 254 of each one of seats 242 in a column 200 may be oriented at a slight angle 256 (e.g., +/−10 degrees or more) relative to the column axis 202 of the column 200 containing the seat 242. As indicated above, in any of the embodiments disclosed herein, the primary egress path 222 of each seat 242 may allow for direct, unimpeded access to an aisle 158 such as when all of the adjacent seats 242 are in the bed configuration 248. For example, the seating arrangements 240 may be configured such that when all the adjacent seats 242 surrounding a given seat 242 are in the bed configuration 248, the seat 242 arrangement provides at least one primary egress path 222 allowing for direct unimpeded access from the given seat 242 to a main aisle 158 of the aircraft cabin 150, as described above.

In FIGS. 6-20F, in at least one column 200 of an inboard column set 206 and/or in at least one column 200 of an outboard column set 204, the seats 242 may be reversed 220 in direction and/or may be staggered 218 relative to the seats 242 in an adjacent column 214 and/or in an across-aisle column 216. As indicated above, each one of the seats 242 may be tapered such that the seat width 260 at the main portion 262 of the seat 242 (e.g., at the seat bottom 264 and/or seat back 266) is greater than the width at the footrest 284 of the seat 242. In some embodiments, the footrest center 288 may be transversely offset 290 from the seat centerline 254. For example, the footrest center 288 may be transversely offset 290 from the seat centerline 254 by approximately 1-10 inches. In some embodiment, the footrest center 288 may be offset from the seat centerline 254 by approximately 3-6 inches.

FIGS. 6-7 illustrate different embodiments of a single-aisle 158 seating arrangement 240 which may be incorporated into an aircraft cabin 150. FIG. 6 shows a 3-2 seating arrangement 240 containing a right-hand outboard column set 204 having three (3) columns 200, and a left-hand outboard column set 204 having two (2) columns 200. FIG. 6 represents a seating arrangement 240 wherein the seats 242 in each one of the columns 200 are reversed 220 in direction relative to the seats 242 in the immediately adjacent column 214 of the same column set. In addition, the seats 242 in all of the columns 200 are longitudinally aligned (e.g., are non-staggered). Advantageously, the tapered configuration of each one of the seats 242 combined with the reversed 220 direction of the seats 242 in the immediately adjacent columns 200 allows for a reduction in the total width of the column sets relative to the seat width 260 if the seats were non-tapered and non-reversed. The reduction in total width of the column sets may allow for an increase in the seat width 260 of the individual seats 242.

FIG. 7 shows a 3-3 seating arrangement 240 containing a pair of outboard column sets 204 separated by an aisle 158 and wherein each one of the outboard column sets 204 includes three (3) columns 200. In the outboard column sets 204, only the seats 242 in the sidewall column 212 are staggered 218 relative to the seats 242 in the column 200 immediately adjacent to the sidewall column 212. In this regard, FIG. 7 represents seating arrangements 240 having outboard column sets 204 containing three (3) or more columns 200 and wherein only the sidewall column 212 is staggered 218 relative to the column 200 immediately adjacent to the sidewall column 212. In the embodiment shown, the sidewall column 212 is staggered 218 by approximately one-half of the seat pitch 282. However, the sidewall column may be staggered by any percentage of the seat pitch 282 that still allows egress from each seat 242 via a primary egress path 226. In addition, FIG. 7 represents seating arrangements 240 wherein the seats 242 in the sidewall column 212 of the outboard column set 204 are facing in the same direction (e.g., facing aft) as the seats 242 in the column 200 immediately adjacent to the sidewall column 212. In addition, FIG. 7 represents seating arrangements 240 wherein the seats 242 in one aisle column 210 are longitudinally aligned (e.g., are non-staggered) with the seats 242 in the other aisle column 210, and are reversed 220 in direction relative to the seats 242 in the other aisle column 210.

Figure 8:
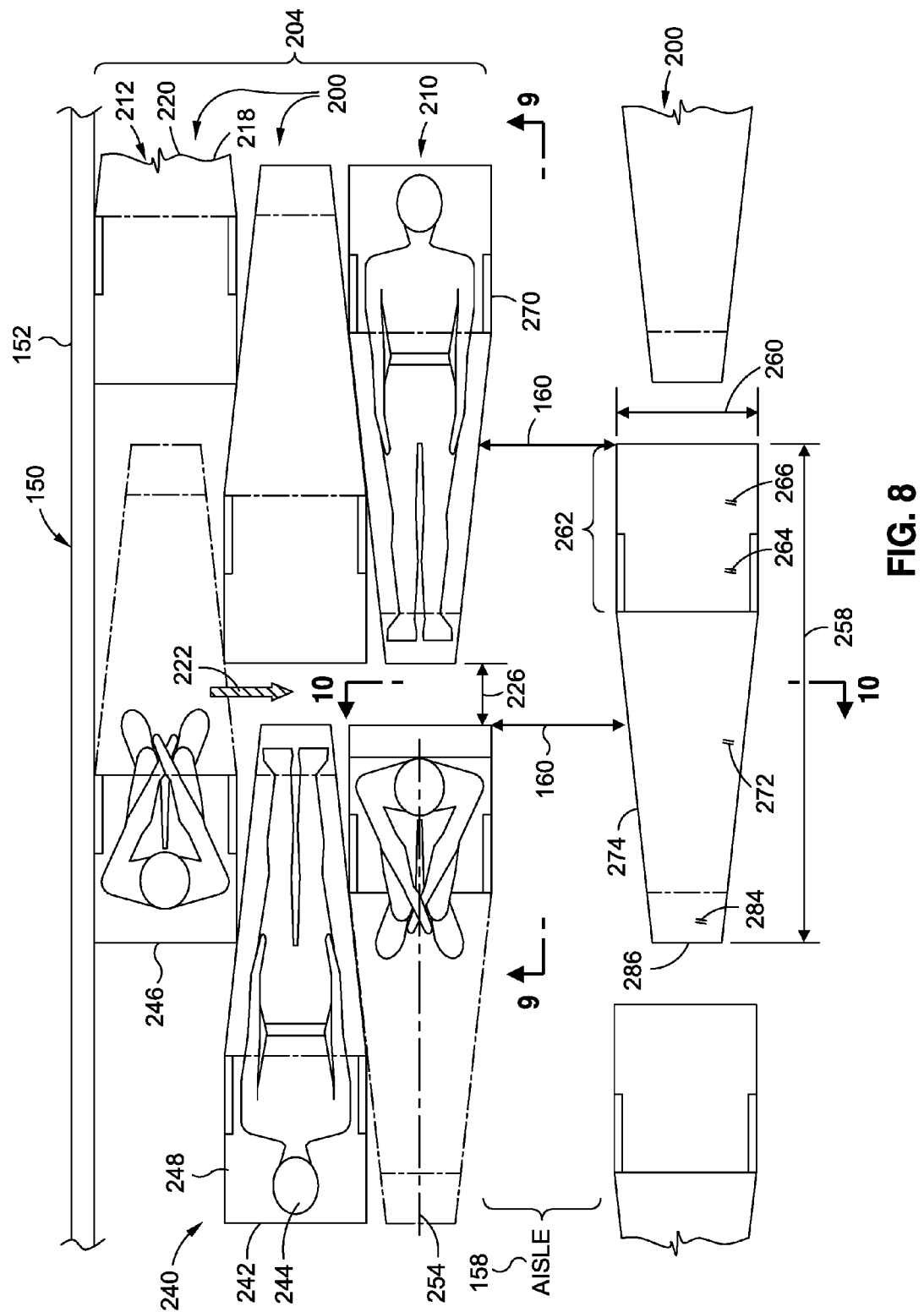
FIG. 8 is an enlarged view of a portion of the seating arrangement of FIG. 7 and illustrating each seat allowing for direct, unimpeded access to an aisle of the aircraft cabin.

FIG. 8 is an enlarged view of a portion of the seating arrangement 240 of FIG. 7. Advantageously, the seating arrangement 240 allows for direct, unimpeded access to the aisle 158 from each seat 242 via a primary egress path 222. In addition, FIG. 8 illustrates the second minimum aisle width 166 (FIG. 10) that may be implemented to reduce the cross-aisle 158 spacing between the seats 242 due to the staggered 218 arrangement of the opposing aisle columns 210 and due to the height of the bed configuration 248 being less than the aisle threshold height 162, as described above.

FIG. 9 is a side view of a pair of seats 242 of the same column 200. The forward seat is shown in the upright, seated configuration 246, and the aft seat is shown in the flat, bed configuration 248. FIG. 9 illustrates the path width 226 of the primary egress path 222 which provides unimpeded access to an aisle 158 from an interior seat 242 (e.g., a non-aisle seat). As indicated above, the path width 226 of the primary egress path 222 may be defined by the seat length 258 of each one of the seats 242 in a column 200, and by the seat pitch 282 between the seats 242 in the column 200.

FIG. 10 is a forward-looking view of a pair of seats 242 separated by an aisle 158 of the aircraft cabin 150 and illustrating the different minimum aisle widths 164, 166 at different heights above the cabin floor 154. The seat 242 on the left is shown in the bed configuration 248 with the leg rest 272 and/or the footrest 284 separated from the seat 242 on the right by the second minimum aisle width 166. As indicated above, certain aviation regulations (e.g., Federal Aviation Regulations—FARs) and their foreign equivalents may allow a first minimum aisle width 164 (e.g., 20 inches) between seats 242 at an aisle threshold height 162 of equal or greater than a predetermined height (e.g., 25 inches) above the cabin floor 154, and a second minimum aisle width 166 (e.g., 15 inches) below the aisle threshold height 162.

Figure 11:
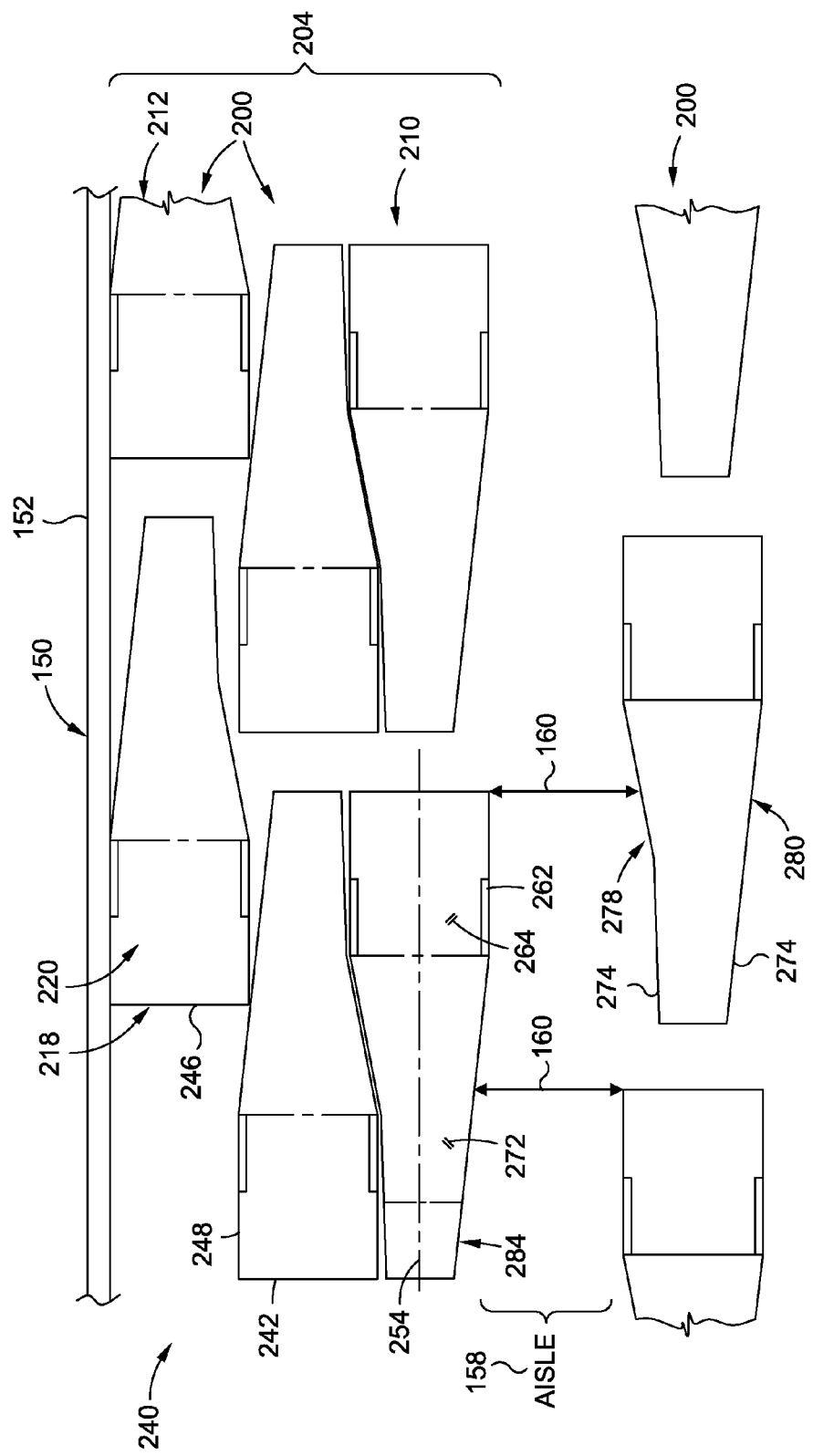
FIG. 11 is a plan view of an example of a seating arrangement containing seats that are non-symmetrical about the longitudinal seat centerline along at least a portion of the seat length.

FIG. 11 shows an embodiment of a seating arrangement 240 containing seats 242 of which at least a portion are non-symmetrical about the seat centerline 254. As indicated above, the seat centerline 254 may be located midway between the opposing seat sides 274 in the region of the seat bottom 264, and may extend in a straight line along the seat length 258. One or more of the seats 242 may include a convex shape 280 and/or a concave shape 278 on one or more of the opposing seat sides 274. For example, in FIG. 11, each one of the seats 242 may have a convex shape 280 along at least a portion of the seat length 258 on one seat side 274, and a generally concave shape 278 extending along at least a portion of the opposite seat side 274.

In FIG. 11, the convex shape 280 of the seat sides 274 in one column 200 may be nested with the concave shape 278 of the seat sides 274 and oriented in a reversed 220 direction relative to an adjacent column 214 of the same column 200 set, and which may advantageously allow for an increase in the seat width 260 of the seat bottoms 264 without increasing the width of the column sets. In addition, by providing a concave shape 278 in the seat sides 274 and by longitudinally staggering columns 200 that are immediately adjacent to one another, the column set width may be reduced which may also allow for an increase in the seat width 260 of individual seats 242. Likewise, longitudinally staggering columns 200 that are located across an aisle 158 from one another, and configuring the seats 242 to take advantage of the smaller minimum aisle width 160 that may be available below an aisle threshold height 162 (e.g., see FIG. 10) above the cabin floor 154 as described above may allow for an increase in the individual seat widths 260.

Although not shown, any one of the seating arrangements 240 shown in FIGS. 6-20 may include seats 242 having footrests 284 that may be offset 290 relative to the seat centerline 254 when the seats 242 are in the bed configuration 248. Any one of the embodiments shown in FIGS. 6 to 20 may implement any of the relative positions and orientations of the seats 242 described above with regard to FIGS. 2-3. For example, the seats 242 in immediately adjacent columns 214 or across-aisle columns 216 may be oriented such that the narrower footrest 284 of the seats 242 in one column 200 are longitudinally positioned at an approximate midpoint 276 of the seats 242 in the adjacent column. In other embodiments, the seats 242 may be longitudinally staggered 218 such that the narrower footrest 284 of the seats 242 in one column 200 are positioned adjacent to the wider main portion 262 (e.g., the seat bottom 264) of the seats 242 in an immediately adjacent column 214 of the same column 200 set. In FIG. 8, the staggering of the cross-aisle seats 242 such that the narrower footrest 284 of the seats 242 in one aisle column 210 are longitudinally positioned directly across from the main portion 262 (e.g., the seat bottom 264) of the seats 242 in the opposing aisle column 210 may allow for an increase in individual seat widths 260.

Referring to FIGS. 12A-18F, shown are examples of twin-aisle seating arrangements 240 that may be determined according to configuration parameters, seat parameters, and configuration rules in a manner described below. Configuration parameters may describe the size, geometry, and configuration of the aircraft cabin 150, and/or the size, geometry, and configuration of a zone or section (e.g., business class section, economy class section, etc.) of the aircraft cabin 150. For example, configuration parameters may describe the cabin width 168 (FIG. 2) and cabin length 170, the total quantity of aisles 158 in the aircraft cabin 150, the minimum aisle width (FIGS. 8 and 10-11), and the total quantity of columns 200 of seats 242 in the aircraft cabin 150 or in a section of the aircraft cabin 150. In some embodiments, the configuration parameters may include zone parameters of the aircraft cabin 150. Zone parameters may include the length 170 (FIG. 2) of a zone or section (e.g., business class or economy class section) of the aircraft cabin 150, a minimum path width 226 (FIG. 9) between seats 242 in the same column 200 in the section, the location and geometry of one or more monuments (not shown) such as section dividers, a galley (not shown), lavatories (not shown), closets (not shown), and other monuments that may be included in or associated with a section of an aircraft cabin 150. Zone parameters may also include the size and location of one or more cross-aisles (not shown) that may be associated with a section. Such cross-aisles may be oriented generally transverse to the longitudinal axis 156 of the aircraft 100. Seat parameters may describe the geometry and dimensions of the seats 242. In this regard, seat parameters may assign values to the seat attributes of the seats. For example, the seat parameters may describe the attributes of the seat width, the seat length, the amount of offset of the footrest relative to the seat centerline, and other seat attributes.

As indicated above, FIGS. 12A-18F show examples of different embodiments of twin-aisle seating arrangements 240 determined according to configuration parameters, seat parameters, and configuration rules. FIGS. 12A-12F, 13A-13F, and 14A-14F each contain nine (9) columns 200 and FIGS. 15A-15F, 16A-16F, 17A-17F, and 18A-18F each contain ten (10) columns 200. Each one of the seating arrangements 240 in FIGS. 12-12F, 13A-13F, . . . , and 18A-18F (i.e., FIGS. 12-12F through 18A-18F) may meet the following configuration rules: each seating arrangement 240 includes at least one outboard column set 204 containing three (3) or more columns 200 and/or at least one inboard column set 206 containing five (5) or more columns 200, and wherein, for at least one column 200 in each outboard column set 204 containing three (3) or more columns 200 and at least one inboard column set 206 containing five (5) or more columns 200: (1) the seats 242 are reversed 220 in direction relative to an adjacent column 214 and/or, (2) the seats 242 are staggered 218 relative to the seats 242 in an adjacent column 214. In addition, in some of the seating arrangements 240, for an inboard column set 206 containing five (5) or more columns 200, only the seats 242 in one or more non-aisle columns 210 may be staggered 218 relative to the seats 242 in an adjacent column 214 of the inboard column set 206. Furthermore, in some of the seating arrangements 240, for an inboard column set 206 containing five (5) or more columns 200, up to two (2) columns 200 may be staggered 218 relative to the respective adjacent columns 200 of the inboard column set 206, and the two (2) staggered 218 columns 200 in the inboard column set 206 may be located immediately adjacent to one another. In some examples, a seating arrangement 240 may provide that for an outboard column set 204, only the sidewall column 212 may be staggered 218 relative to the remaining column 200 in that outboard column set 204. In some examples, outboard column sets 204 containing less than three (3) columns 200 and inboard column sets 206 containing less than five (5) columns 200 may contain at least two (2) columns 200.

FIGS. 12A-18F also show a primary egress path 222 and a secondary egress path 224 for each seat in the seating arrangement 240, except for the aisle seats 242 which may only have a primary egress path 222. As indicated above, the seating arrangements 240 may be configured such that each seat (e.g., each non-aisle seat) has a primary egress path 222 that may allow for direct, unimpeded access from the seat 242 to the aisle 158 when the adjacent seats 242 are in the bed configuration 248. In this regard, a primary egress path 222 allows a passenger 244 to walk on the cabin floor 154 from their seat 242 to the main aisle 158 without being impeded by any portion of any seat 242 (e.g., by an adjacent seat 242), whether the adjacent seats 242 are in the seated configuration 246 or in the bed configuration 248, and without disturbing passengers in other seats 242 and without stepping over any seats 242 in the bed configuration 248. In some seating arrangements, the secondary egress path 224 may allow access to the aisle 158 when the adjacent seats 242 are in the seated configuration 246. For example, when the seats 242 are arranged in staggered 218 columns, a passenger 244 may use a secondary egress path 224 to exit their seat 242 through an area formerly occupied by adjacent seats 242 in the bed configuration 248. However, in some seating arrangements (e.g., see FIG. 13C), a secondary egress path 224 may not be available for non-aisle seats 242 when adjacent seats 242 are in the seated configuration 246.

In FIGS. 12-12F through 18A-18F, the staggered 218 and/or reversed 220 configurations of the seating arrangements 240 are relative to non-staggered (e.g., longitudinally aligned) and non-reversed (e.g., all seat 242 face same direction) baseline seating arrangements 241 respectively illustrated in FIGS. 12F through 18F (e.g., FIGS. 12F, 13F, 14F, . . . , 18F), and which the seating arrangements 240 in FIGS. 12-12F through 18A-18F improve upon. The seating arrangements 240 in FIGS. 12-12F through 18A-18F include outboard column sets 204 of three (3) and four (4) columns 200, and inboard column sets 206 of five (5) and six (6) columns 200. However, other seating arrangements 240 may be provided with alternative quantities of columns 200 in the outboard column sets 204 and inboard column sets 206.

As indicated above, 12A-12F, 13A-13F, and 14A-14F show twin-aisle seating arrangements 240 containing nine (9) columns 200 of seats 242, and FIGS. 15A-15F, 16A-16F, 17A-17F, and 18A-18F contain ten (10) columns 200 of seats 242. Each seating arrangement 240 illustrates the primary and secondary egress path 224, 226 for each seat 242. FIGS. 12A-12F show five (5) different embodiments of a 2-5-2 seating arrangement 240 meeting the above-noted seating rules. FIGS. 13A-13F show five (5) different embodiments of a 2-4-3 seating arrangement 240 meeting the above-noted seating rules. FIGS. 14A-14F show five (5) different embodiments of a 3-3-3 seating arrangement 240 meeting the above-noted seating rules. FIGS. 15A-15F show five (5) different embodiments of a 3-4-3 seating arrangement 240 meeting the above-noted seating rules. FIGS. 16A-16F show five (5) different embodiments of a 2-4-4 seating arrangement 240 meeting the above-noted seating rules. FIGS. 17A-17F show five (5) different embodiments of a 2-5-3 seating arrangement 240 meeting the above-noted seating rules. FIGS. 18A-18F show five (5) different embodiments of a 2-6-2 seating arrangement 240 meeting the above-noted seating rules.

In each seating arrangement 240 shown in FIGS. 12A, 13A, 14A, 15A, 16A, 17A, and 18A (i.e., 12A through 18A), one pair of immediately-adjacent columns 214 in each column set face the same direction and are staggered 218, and each pair of across-aisle columns 216 face the same direction and are staggered 218. In each seating arrangement 240 shown in FIGS. 12B, 13B, 14B, 15B, 16B, 17B, and 18B (i.e., FIGS. 12B through 18B), the immediately-adjacent columns 214 in each column set are reversed 220 in direction and are non-staggered, and each pair of across-aisle columns 216 face the same direction and are staggered 218. In each seating arrangement 240 shown in FIGS. 12C through 18C, one pair of immediately-adjacent columns 214 in each column set face the same direction and are staggered 218, and each pair of across-aisle columns 216 are reversed 220 in direction and are non-staggered. In each seating arrangement 240 shown in FIGS. 12D through 18D, the immediately-adjacent columns 214 in each column set are reversed 220 in direction and are non-staggered, and each pair of across-aisle columns 216 are reversed 220 in direction and are non-staggered. In each seating arrangement 240 shown in FIGS. 12F through 18F, one pair of immediately-adjacent columns 214 in each column 200 set face the same direction and are staggered 218, and each pair of across-aisle columns 216 face the same direction and are non-staggered. The above-noted seating rules applied to a single-aisle aircraft cabin 150 may result in the seating arrangement 240 shown in the above-described FIGS. 6-7.

FIGS. 19A-19B are examples of an aircraft cabin 150 with different embodiments of a 3-3-3-3 triple-aisle seating arrangement 240. In the seating arrangement 240 shown in FIG. 19A, the immediately-adjacent columns 200 in each outboard column set 204 are reversed 220 in direction and are non-staggered, the columns 200 in each inboard column set 206 face the same direction and are staggered 218, and each pair of across-aisle columns 216 are reversed 220 in direction and are non-staggered. In the seating arrangement 240 shown in FIG. 19B, the immediately-adjacent columns 200 in each outboard column set 204 are reversed 220 in direction and are non-staggered, the columns 200 in each inboard column set 206 face the same direction and are staggered 218, and each pair of across-aisle columns 216 are reversed 220 in direction and are non-staggered. FIGS. 19A-19B also show the primary and secondary egress path 224, 226 for each seat 242.

It should be noted that a triple-aisle seating arrangement 240 is not limited to the seating arrangements 240 shown in FIGS. 19A-19B. In this regard, a triple-aisle seating arrangement 240 may be provided in any one of a variety of embodiments that satisfy the above-noted configuration rules wherein at least one outboard column set 204 contains three (3) or more columns 200 and/or at least one inboard column set 206 contains five (5) or more columns 200, and wherein, for at least one column 200 in each outboard column set 204 containing three (3) or more columns 200 and at least one inboard column set 206 containing five (5) or more columns 200: (1) the seats 242 are reversed 220 in direction relative to an adjacent column 214 and/or, (2) the seats 242 are staggered 218 relative to the seats 242 in an adjacent column 214. For example, a triple-aisle aircraft cabin 150 may be provided in a 2-5-3-2 seating arrangement, a 2-4-4-2, seating arrangement, or other seating arrangements.

Figure 20A:
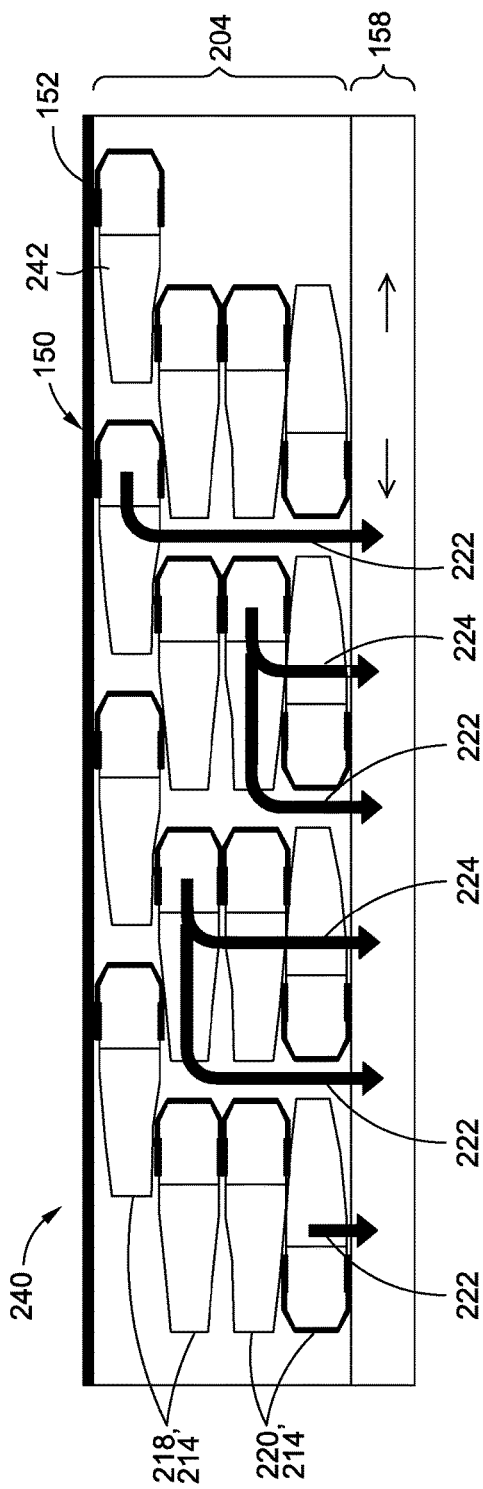
Figure 20B:
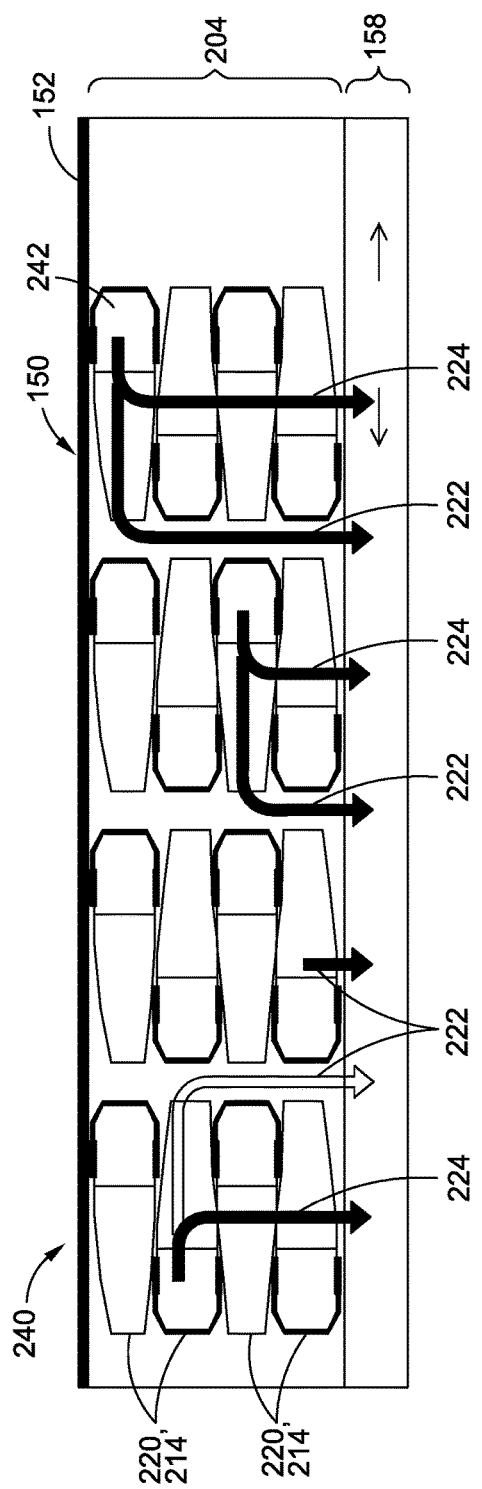
Figure 20C:
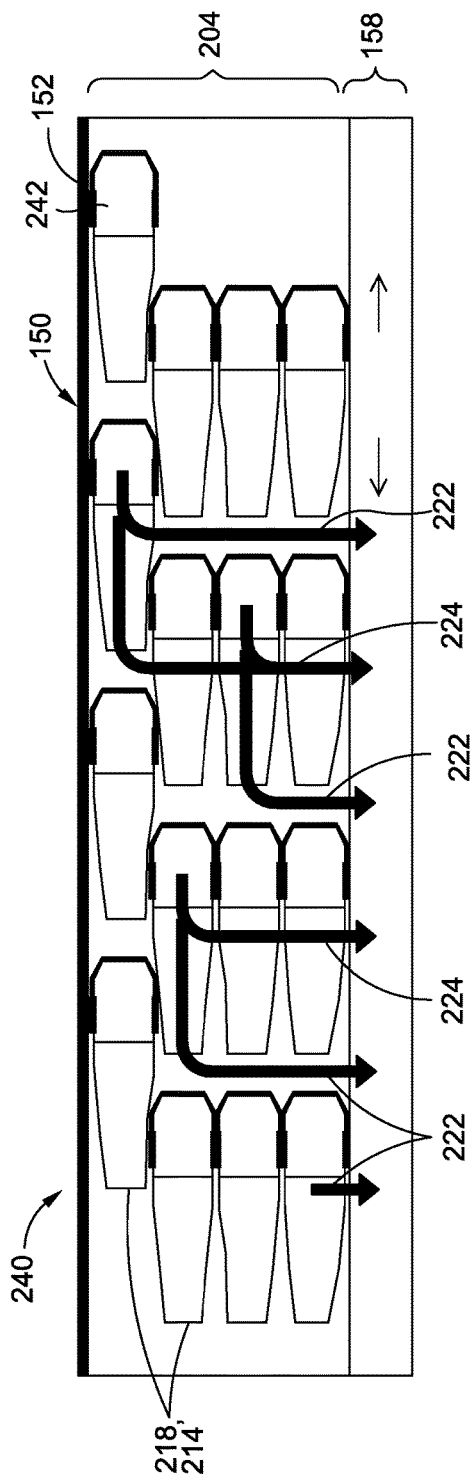
Figure 20D:
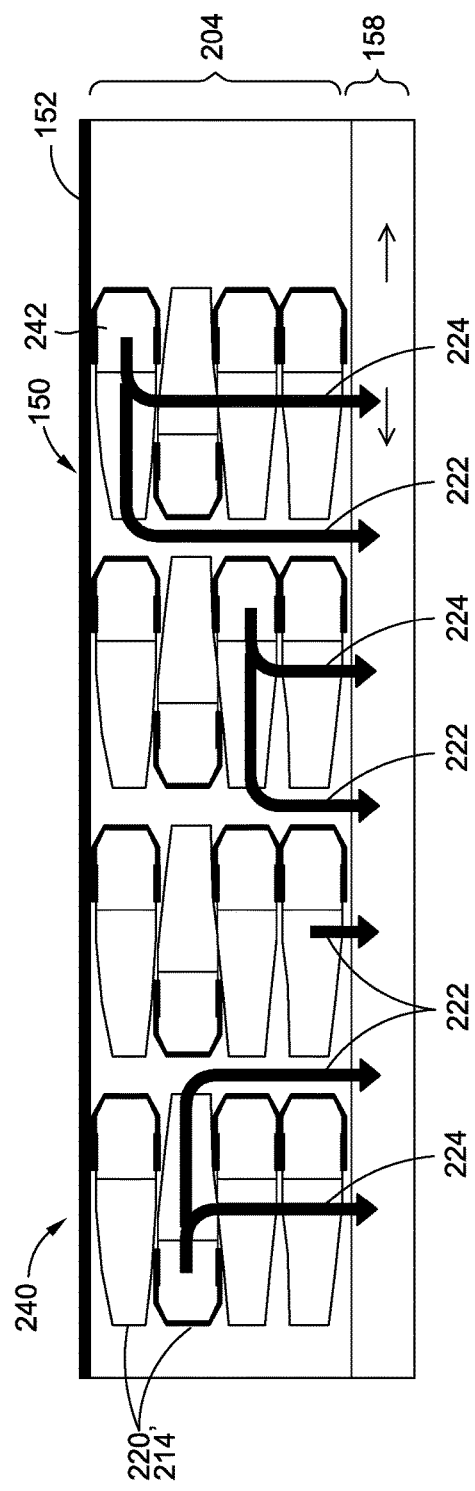

FIGS. 20A-20F show examples of arrangements for an outboard column set 204 having four (4) columns 200 of seats 242. In FIG. 20A, the sidewall column 212 is facing the same direction and is staggered 218 relative to its immediately adjacent column 214, and the aisle column 210 is reversed 220 in direction and is non-staggered relative to its immediately adjacent column 214. In FIG. 20B, the sidewall column 212 is reversed 220 in direction and is non-staggered relative to its immediately adjacent column 214, and the aisle column 210 is reversed 220 in direction and is non-staggered relative to its immediately adjacent column 214. In FIG. 20C, the sidewall column 212 is facing the same direction and is staggered 218 relative to its immediately adjacent column 214, and the aisle column 210 is facing the same direction and is non-staggered relative to its immediately adjacent column 214. In FIG. 20D, the sidewall column 212 is reversed 220 in direction and is non-staggered relative to its immediately adjacent column 214, and the aisle column 210 is facing the same direction and is non-staggered relative to its immediately adjacent column 214. In FIG. 20E, the sidewall column 212 is facing the same direction and is staggered 218 relative to its immediately adjacent column 214, and the aisle column 210 is reversed 220 in direction and is non-staggered relative to its immediately adjacent column 214. In FIG. 20F, the sidewall column 212 is reversed 220 in direction and is non-staggered relative to its immediately adjacent column 214, and the sidewall column 212 is also reversed 220 in direction and is non-staggered relative to its immediately adjacent column 214. FIGS. 20A-20F also show the primary and secondary egress path 224, 226 for each seat 242, with the exception of the aisle columns in all of the seating arrangements of FIGS. 6-7 and 12-20 in which the seats 242 in the aisle columns have only a primary egress path 224.

Figure 21:
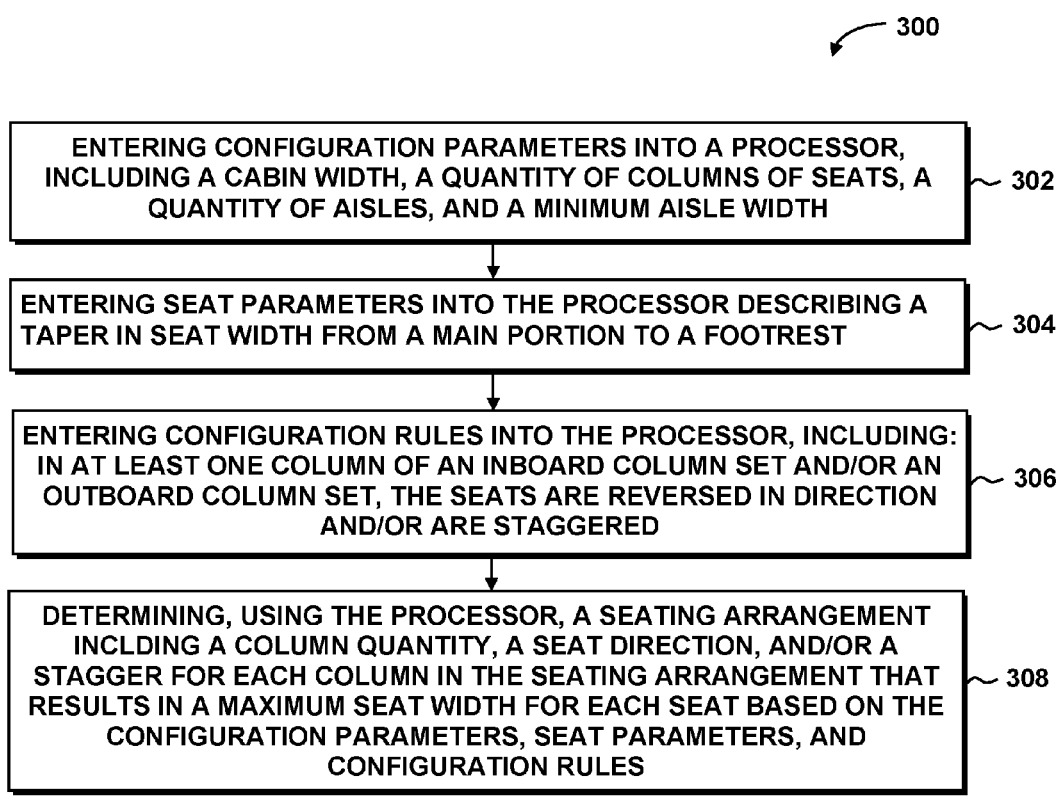
FIG. 21 is a flowchart illustrating one or more operations that may be included in a method of determining a seating arrangement for an aircraft cabin.

FIG. 21 shows a flowchart containing one or more operations that may be included in a method 300 of determining and/or optimizing a seating arrangement 240 for an aircraft cabin 150. Step 302 of the method 300 may include entering one or more configuration parameters into a processor. The processor may execute computer readable program instructions (not shown) to enable the processor to perform one or more operations associated with determining one or more seating arrangements 240 of an aircraft cabin 150. The computer readable program instructions may be contained on tangible or non-tangible computer readable media (not shown) which may be loaded onto or transferred to a processor-based system (not shown) for execution by the processor. In Step 302, the configuration parameters that may be entered into the processor may include, but are not limited to, the cabin width 168 (FIG. 2), the total quantity of aisles 158 (FIG. 2) in the aircraft cabin 150, the minimum aisle width 160, and the total quantity of columns 200 (FIG. 2) of seats 242 (FIG. 2) in the aircraft cabin 150. In some examples, the method 300 may include entering additional configuration parameters including, but not limited, the minimum aisle width 164 (FIG. 10) above an aisle threshold height 162 and the minimum aisle width 166 (FIG. 10) below the aisle threshold height 162, as illustrated in FIG. 10 and described above. The method 300 may also include entering a minimum and/or a maximum path width 266 of the primary egress path 222 (FIG. 2) between the seats 242, as shown in FIG. 9 and described above. As indicated above, an aircraft cabin 150 may include any number of a variety of configuration parameters, any one or more of which may be entered into the processor for determining a seating arrangement 240 of the aircraft cabin 150.

Step 304 of the method 300 may include entering into the processor the seat parameters (e.g., a numerical value or a range of values) assigned to the seat attributes. Each seat 242 may have the attribute of being movable between a seated configuration 246 and a bed configuration 248. One or more seat parameters may be entered into the processor describing the taper in the seat width 260 along the seat length 258 from a main portion 262 of the seat 242 to the footrest 284 when the seat 242 is in the bed configuration 248. As indicated above, the main portion 262 of the seat 242 may be defined as the widest portion (e.g., external dimensions) of the seat 242 when the seat 242 is in the bed configuration 248. The main portion 262 of the seat 242 may be located at an end of the seat 242 opposite the footrest 284. The seat taper may also be described by entering a ratio or ratio range of the seat width 260 at the main portion 262 to the seat width 260 at the footrest 284. The seat taper may also be described in terms of taper angle, or using other seat parameters. Seat parameters (e.g., a numerical value, a minimum value, a maximum value, a value range) may also be entered describing the seat length 258. For example, seat parameters may include: a minimum seat length 258 of the seat 242 in the bed configuration 248, a minimum seat length 258 of the seat 242 in the seated configuration 246, a minimum seat width 260 at the footrest 284, a maximum offset of the footrest 284 from the seat centerline 254. For example, the method 300 may include entering a seat parameter value for the amount of offset 290 of the footrest 284 in a transverse direction relative to the seat centerline 254, as described above. Additional seat parameters may be entered to describe the attribute of a non-symmetrical geometry of each seat 242 about the seat centerline 254 along at least a portion of the seat length 258. Other seat parameters may be entered to describe seat attributes of a concave shape 278 and/or a convex shape 280 of one or both of the opposing seat sides 274 of each seat 242 along at least a portion of the seat length 258.

In the above examples, substantially similar values for the seat parameters may be assigned to all seats 242 within an aircraft cabin 150 or within a given section of an aircraft cabin 150. In this regard, common seat parameters may represent that all seats 242 in a given section (e.g., economy class) have the same size, shape (e.g., footprint) and configuration. However, it is contemplated that a user may assign seat parameters to seats 242 in one column 200 or column set (e.g., the inboard column sets), and assign different seat parameters to the seats 242 in another column 200 or column set (e.g., the outboard column sets). Variations in seat parameters may also differ according to rows, or by other means.

Step 306 of the method 300 may include entering configuration rules into the processor. In some examples, the configuration rules may allow or require that in at least one column 200 of an inboard column set 206 and/or an outboard column set 204, the seats 242 are reversed 220 in direction and/or are staggered 218, as shown in one or more of the seat 242 arrangements of FIGS. 6-7 and FIGS. 12-12F through 18A-18F. In some examples, a configuration rule may allow or require that in at least one column 200 of an inboard column set 206 and/or an outboard column set 204, the seats 242 are reversed 220 in direction and are transversely aligned (e.g., are non-staggered) with the seats 242 in an adjacent column 214 and/or an across-aisle column 216, as shown in the series of seating arrangements 240 of FIGS. 12D through 18D. Furthermore, a configuration rule may allow or require that in at least one column 200 of an inboard column set 206 and/or an outboard column set 204, the seats 242 have the same direction and are staggered 218 relative to the seats 242 in an adjacent column 214 and/or an across-aisle column 216, as shown in the series of seating arrangements 240 of FIGS. 12F through 18F. Configuration rules may also be entered allowing or requiring seats 242 to be nested together such that at least a portion of the seat sides 274 of adjacent seats 242 are in contact with one another, or a seat parameter may be entered describing the maximum spacing between the seats in adjacent aisles.

Additional configuration rules may be entered allowing or requiring that the seats 242 in at least one column 200 are staggered 218 such that the footrest 284 of the seats 242 in one column 200 are located at an approximate midpoint 276 of the seats 242 in an adjacent column. In some examples, the configuration rules may allow or require that at least one outboard column set 204 contains three (3) or more columns 200 and/or at least one inboard column set 206 contains five (5) or more columns 200, resulting in the single-aisle, representations of which are illustrated in the seating arrangements of FIGS. 6-7 and the double-aisle seating arrangements 240 of FIGS. 12-12F through 18A-18F. Any one of a variety of additional configuration rules may be entered allowing or requiring that a seating arrangement is non-symmetrical about the longitudinal centerline 156 of the aircraft cabin 150. Configuration rules may also allow or require that certain columns 200 are aft-facing and certain columns 200 are forward-facing.

Upon entering the configuration parameters, seat parameters, and configuration rules into the processor, the method may include Step 308 of determining, using the processor, a seating arrangement 240 including defining the column 200 quantity in each one of the inboard and outboard column sets 206, 204, a seat direction (e.g., forward or aft facing), and/or a stagger for each column 200 in the seating arrangement 240 that results in a maximum seat width 260 for each seat 242 based on the configuration parameters, seat parameters, and configuration rules, and which maximizes seat density within the aircraft cabin 150. In this regard, the processor may use the configuration rules to maximize the seat widths 260 to optimize the use of floor space in the aircraft cabin 150 such that a maximum number of seats 242 (e.g., per unit length) may be installed with a given section (e.g., first class section, business class section, etc.) of the aircraft cabin 150. In some examples, the method may include generating a layout and/or a graphic representation of one or more seating arrangements 240 that result in the maximized seat width 260 for all the seats 242 in the seating arrangement 240 and maximized seat density. In some examples the method may include entering a seat width range and determining a set of valid seating arrangement solutions that satisfy the configuration rules, and entering one or more additional configuration rules to select from the set of valid seating arrangement solutions an optimized seating arrangement solution that provides a maximized seat width for each seat 242.

In implementing the above-described method for a twin-aisle, 10-column seating arrangement 240, the columns 200 may be designated 0-9 starting from the right-hand side of the aircraft cabin 150 (e.g., facing forward) and designating the sidewall column 212 as 0 in accordance with a 0-based array for implementing the method. As indicated earlier, any one of columns 200 may be forward-facing or aft-facing. The seat attributes for forward-facing and aft-facing may be modeled as a 10-bit binary number wherein 0 designates a non-reversed column (e.g., a forward-facing column) and 1 designates a reversed column (e.g., an aft-facing column). Using the above noted nomenclature, the designation 0000000001 indicates that the sidewall column 212 on the right-hand side of the aircraft cabin 150 is reversed 220 in direction relative to the remaining 9 columns. For a 10-column seating arrangement 240, there are 1024 possible permutations for the direction of the columns 200. As indicated above, one or more configuration rules may be applied to reduce the number of possible seating arrangements.

The number of possible aisle-column combinations for a twin-aisle, 10-column seating arrangement 240 may be reduced by applying one or more configuration rules. For example, a configuration rule may be implemented requiring that each one of the outboard column sets 204 has at least two columns 200, and another configuration rule may be implemented requiring that the outboard column sets 204 have no more columns 200 than the inboard column set 206. Applying the above two (2) configuration rules may reduce the number aisle-column combinations to four (4) as is illustrated in FIGS. 15-18. For example, FIGS. 15A-15F show a 3-4-3 seating arrangement 240, FIGS. 16A-16F show a 2-4-4 seating arrangement 240, FIGS. 17A-17F show a 2-5-3 seating arrangement 240, and FIGS. 18A-18F show a 2-6-2 seating arrangement 240. In some examples, a configuration rule may be implemented requiring a specific aisle-column configuration of the seating arrangement 240. For example, for a 10-column, 2-aisle arrangement, a configuration rule may be implemented requiring a 2-5-3 aisle-column configuration.

The number of column-stagger permutations for the twin-aisle, 10-column seating arrangement 240 may also be reduced by applying one or more configuration rules. In this regard, the method may pre-filter to valid stagger locations such that for each aisle 158 location, there are only a small number (e.g., approximately 15 to 24) of valid column stagger positions that provide a primary egress path 222 for each seat 242, such that the method only searches for the optimal solution and avoids evaluating non-valid solutions. The method may use a 10-bit binary number to model column-stagger similar to the above-described 10-bit binary designation for seat direction. In one example, the configuration rules for a valid stagger location may allow or require that each outboard column set 204 may have 0 or 1 staggered columns. For example, a staggered 218 column 200 in the outboard column sets 204 would be a sidewall column 212 located immediately adjacent to the sidewall 152 of the aircraft cabin 150. For an inboard column set 206, the configuration rules may allow or require that 0, 1, or 2 columns 200 may be staggered 218, and that if two (2) columns 200 of the inboard column set 206 are staggered 218, the two (2) columns 200 must be located immediately adjacent to one another. Another configuration rule may allow or require that one or more staggered 218 columns 200 of the inboard column set 206 are centered in the inboard column set 206 or are non-aisle columns 210 of the inboard column set 206. For example, according to the above-noted configuration rules, if an inboard column set 206 contains five (5) columns 200, the column-stagger permutation 10000 will not be considered. However, the symmetrical permutation 00100 will be considered as will non-symmetrical permutations 01000 and 00010.

Column sets may also be staggered 218. For example, an entire column 200 set may be staggered 218 relative to other column sets in the seating arrangement 240 as shown in FIGS. 12B through 18B. A stagger of one-half of the seat pitch 282 may have the same result as inverting the stagger for each column 200 in the column set relative to a common datum (not shown) of the aircraft cabin 150. Staggering of columns sets 204, 206 adds the variable of cross-aisle stagger while preserving the above-described column-stagger capability.

The above-noted configuration rules may be implemented in the method as a means to maximize the seat width 260 of each seat 242 at the main portion of the seat 242. The main portion 262 of the seat 242 may include the seat bottom 264 and/or the seat back 266, and may be generally located at an end of the seat 242 opposite the footrest 284. As indicated above, each one of the seats 242 may be tapered such that the footrest 284 is narrower than the main portion 262 (e.g., the seat bottom 264). The footrest 284 area may occupy a portion of the egress path 222 for the seat 242 such that the width of the footrest 284 may be based on the minimum path width 226 of the egress path 222.

As indicated above, the method may also take advantage of the narrower width of the footrest 284 by staggering columns 200 such that the relatively narrow footrest 284 area of one seat 242 is located next to the relatively wide main portion 262 (e.g., the widest portion) of the seat 242 in an adjacent column 200. In this manner, the seats 242 in adjacent columns 200 may be moved closer together in the transverse direction (e.g., the column set width is reduced), and allowing the distance to be recouped (e.g., width recovery) by allowing for an increase in the seat width 260 of the main portion 262 (e.g., the seat bottom 264) of each one of the seats 242.

The present method may incorporate one or more strategies for positioning the footrests 284 of the seats 242 in one column 200 adjacent to the main portion 262 of the seats 242 in an adjacent column. For example, seats 242 in one column 200 may be staggered in a forward/aft direction relative to the seats 242 in an adjacent column. Another strategy may be to reverse the direction of the seats 242 in one column 200 relative to the direction of seats 242 in the adjacent column. The two (2) strategies create four (4) options for orienting and positioning the seats 242 in adjacent columns 200, including: (1) the seats face the same direction and are non-staggered, (2) the seats are reversed in direction and are non-staggered, (3) the seats face the same direction and are staggered, and (4) the seats are reversed in direction and are staggered. As indicated above, the method may consider zone configurations which may include cabin-level considerations such as location and geometry of the above-described monuments, the length of the zones or sections (e.g., cabin length 170—FIG. 2) of the aircraft cabin, location of cross-aisles, and other considerations.

With regard to the above-noted four (4) options for orienting and positioning seats 242 in adjacent columns 200, option (1) is illustrated in FIGS. 12F through 18F and positions the main portion 262 (e.g., the widest portions) of the seats 242 in one column 200 adjacent to the main portion 262 of the seats 242 in the adjacent column 214 such that no width recovery benefit is provided. Option (2) is illustrated in FIGS. 12D through 18D and positions the footrest 284 of the seats 242 in one column 200 adjacent to the main portion 262 of the seats 242 in the adjacent column 214 such that some width recovery benefit is provided and which may translate into an increase in the seat width 260 of all seats 242 in the seating arrangement 240. Options (3) and (4) are illustrated in FIGS. 12A-C and 12F through 18A-C and 18F, and position the footrest 284 of the seats 242 in one column 200 adjacent to some location (e.g., midway) along the seat length 258 of the seats 242 in the adjacent column 214 such that some width recovery benefit is provided. The amount of width recovery benefit is dependent upon the amount of stagger (e.g., one-half of the seat pitch 282 or other percentage of seat pitch 282) and is also dependent upon the specific geometry and shape of the seats 242 including the relative dimensions of the seat width 260 at the footrest 284 and at other locations along the seat length 258. The above-described method may select the option that provides the greatest benefit in terms of maximum seat width 260 at the main portion 262.

The present method may also incorporate one or more strategies for positioning the footrests 284 of the seats 242 in an aisle column 210 relative to the main portion 262 of the seats 242 in an opposing aisle column 210. In this regard, the above noted four (4) options for positioning and orienting seats 242 of immediately-adjacent columns 214 may be implemented in positioning and orienting seats 242 of cross-aisle columns 216 as a means to increase the width 260 of the seat bottoms 264 for a given aisle width 160 criteria. As indicated above, some aircraft 100 may have a first minimum aisle width 164 (FIG. 10) between seats 242 (e.g., at least 20 inches) at a predetermined aisle threshold height 162 (e.g., 25 inches or more) above the cabin floor 154, and a second minimum aisle width 166 (FIG. 10) between seats 242 (e.g., at least 15 inches) below the aisle threshold height 162. In this regard, the positioning and orienting seats 242 in cross-aisle columns 216 may allow for the use of the smaller second minimum aisle width 166, and which may provide a width recovery benefit that may allow for an increase in the maximum seat width 260 at the seat bottoms 264.

As may be appreciated, the determination of the best seating arrangement 240 may be dependent upon any one of a variety of factors including, but not limited to, the geometry of each seat 242 including seat width 260 dimensions along the seat length 258, seat access, and passenger comfort. In addition, factors such as the distance along each egress path from each seat 242 to the main aisle, flight attendant access to each seat 242, whether the main aisles 158 are straight or non-straight (e.g., a straight aisle width 160 may be greater than the local width of a non-straight aisle), location and availability of overhead storage, seat privacy for forward-facing or aft-facing seat directions, availability of screens and/or partitions for privacy, details of seat design, functionality, mechanics, and appearance, as well as commonality of parts.

Additional modifications and improvements of the present disclosure may be apparent to those of ordinary skill in the art. Thus, the particular combination of parts described and illustrated herein is intended to represent only certain embodiments of the present disclosure and is not intended to serve as limitations of alternative embodiments or devices within the spirit and scope of the disclosure.

What is claimed is:

1. A method of determining a seating arrangement for an aircraft cabin, comprising the steps of:
    entering configuration parameters into a processor, including a cabin width, a quantity of aisles, a minimum aisle width, and a quantity of columns of seats, wherein each seat is movable between a seated configuration and a bed configuration having a seat width that tapers from a main portion to a footrest;
    entering seat parameters describing a taper in seat width from the main portion to the footrest;
    entering configuration rules into the processor, including:
        in at least one column of at least one of an inboard column set and an outboard column set, the seats are at least one of reversed in direction and staggered; and
    determining, using the processor, a seating arrangement including a column quantity in each column set, and at least one of a seat direction and a stagger for each column in the seating arrangement that results in a maximum seat width at a main portion of the seats.

2. The method of claim 1, wherein the configuration rules further include:
    the seats are arranged in at least one outboard column set containing at least one of three or more columns and at least one inboard column set containing five or more columns.

3. The method of claim 1, further including:
    entering into the processor a seat parameter of a maximum offset of the footrest from a seat centerline.

4. The method of claim 1, wherein the configuration rules further include:
    in at least one column of at least one of an inboard column set and an outboard column set, a maximum of two columns are staggered; and
    in an inboard column set, if two columns are staggered, the columns are adjacent to one another.

5. The method of claim 1, wherein the configuration parameters include zone parameters, the method further including:
    entering zone parameters into the processor including a cabin length and a minimum path width between the seats in a same column; and
    entering into the processor a seat parameter of a minimum seat length.

6. The method of claim 1, wherein the configuration rules further include:
    in at least one column of at least one of an inboard column set and an outboard column set, the seats are reversed in direction and are transversely aligned with the seats in at least one of an adjacent column and an across-aisle column.

7. The method of claim 1, wherein the configuration rules further include:

in at least one column of at least one of an inboard column set and an outboard column set, the seats have a same direction and are staggered relative to the seats in at least one of an adjacent column and an across-aisle column.

8. The method of claim 1, wherein the configuration rules further include:
in at least one column the seats are staggered such that the footrest of the seats in one column are located at an approximate midpoint of the seat in an adjacent column.

9. The method of claim 1, wherein the configuration rules further include:
in at least one column the footrest of the seats are located adjacent to a seat bottom of a seat in an adjacent column.

10. The method of claim 1, wherein the configuration rules further include:
the seating arrangement is non-symmetrical about a longitudinal centerline of the aircraft cabin.

11. The method of claim 1, wherein:
each seat has a seat centerline oriented at a seat angle relative to a longitudinal axis of an aircraft cabin.

12. The method of claim 1, wherein:
each seat has a seat centerline;
the seats are arranged in at least one column; and
the seat centerline of the seats in the at least one column are parallel to one another.

13. The method of claim 1, wherein:
the seats are arranged in two or more columns; and
the footrest of a seat in one column faces the footrest of a seat of an adjacent column.

14. The method of claim 1, wherein:
the seats are arranged in at least one outboard column set containing at least one of three or more columns and at least one inboard column set containing five or more columns.

15. The method of claim 1, wherein:
the seating arrangement includes at least two aisles.

16. The method of claim 1, wherein:
the seats in adjacent columns are staggered.

17. A method of determining a seating arrangement for an aircraft cabin, comprising the steps of:
entering configuration parameters into a processor, including a cabin width, a quantity of aisles, a minimum aisle width, and a quantity of columns of seats, wherein each seat is movable between a seated configuration and a bed configuration having a seat width that tapers from a main portion to a footrest, each seat having direct, unimpeded access to an aisle of the aircraft cabin when adjacent seats are in the bed configuration;
entering seat parameters describing a taper in seat width from the main portion to the footrest;
entering configuration rules into the processor, including:
in at least one column of at least one of an inboard column set and an outboard column set, the seats are at least one of reversed in direction and staggered; and
determining, using the processor, a seating arrangement including a column quantity in each column set, and at least one of a seat direction and a stagger for each column in the seating arrangement that results in a maximum seat width at a main portion of the seats.

18. The method of claim 1, wherein:
the aircraft cabin has opposing sidewalls and a single aisle dividing the seats into an outboard column set containing two columns and an outboard column set containing three columns, each outboard column set has a sidewall column located immediately adjacent one of the sidewalls and an aisle column located immediately adjacent the aisle, the seats in each outboard column set are non-reversed;
each seat has a seat centerline oriented at a seat angle relative to a longitudinal axis of an aircraft cabin;
in each column, the seat centerline of the seats are parallel to one another;
in the outboard column set containing two columns:
the seats in the sidewall column are staggered relative to the seats in the aisle column;
the seat centerline of the seats in the sidewall column are non-parallel to the seat centerline of the seats in the aisle column; and
in the outboard column sets containing three columns:
the seats in the sidewall column are staggered relative to the seats in the column located between the sidewall column and the aisle column;
the seat centerline of the seats in the sidewall column are non-parallel to the seat centerline of the seats in the column located between the sidewall column and the aisle column;
the seats in the aisle column are generally longitudinally aligned with the seats in the column immediately adjacent; and
the seat centerline of the seats in the aisle column are parallel to the seat centerline of the seats in the column located between the sidewall column and the aisle column.

19. The method of claim 1, wherein:
the aircraft cabin has opposing sidewalls and a single aisle dividing the seats into an outboard column set containing two columns and an outboard column set containing three columns, each outboard column set has a sidewall column located immediately adjacent one of the sidewalls and an aisle column located immediately adjacent the aisle, the seats in each outboard column set are non-reversed;
each seat has a seat centerline;
in each column, the seat centerline of the seats are parallel to one another;
in the outboard column set containing two columns:
the seats in the sidewall column are staggered relative to the seats in the aisle column;
the seat centerline of the seats in the sidewall column and the aisle column are parallel to each other and are oriented at a seat angle relative to a longitudinal axis of an aircraft cabin; and
in the outboard column sets containing three columns:
the seats in the sidewall column and the seats in the aisle column are staggered relative to the seats in the column located between the sidewall column and the aisle column;
the seat centerline of the seats in the sidewall column, the aisle column, and the column between the sidewall column and the aisle column are non-parallel to each other; and
the seat centerline of the seats in the column between the sidewall column and the aisle column are parallel to the longitudinal axis of the aircraft cabin.

20. The method of claim 1, wherein:
the aircraft cabin has opposing sidewalls and a pair of aisles dividing the seats into a pair of outboard column sets each containing two columns, and an inboard column set containing four columns, each outboard column set has a sidewall column located immediately adjacent one of the sidewalls and an aisle column located immediately adjacent the aisle, the inboard column set has a pair of aisle columns on opposite sides of the inboard column set, the seats in each column set are non-reversed;

each seat has a seat centerline;

in each column, the seat centerline of the seats are parallel to one another and non-parallel to a longitudinal axis of an aircraft cabin;

in each outboard column set:
  the seats in the sidewall column are staggered relative to the seats in the aisle column;
  the seat centerline of the seats in the sidewall column and the aisle column are parallel to each other and are oriented at a seat angle relative to a longitudinal axis of an aircraft cabin; and in the inboard column set:
  the seats in each column are staggered relative to the seats in the column immediately adjacent thereto;
  the seat centerline of the seats in each aisle column are parallel to the seat centerline of the seats in the column immediately adjacent thereto;
  the seat centerline of the seats in one aisle column is non-parallel to the seat centerline of the seats in the remaining aisle column.

21. The method of claim 1, wherein:
the aircraft cabin has opposing sidewalls and a pair of aisles dividing the seats into a pair of outboard column sets each containing two columns, and an inboard column set containing a pair of aisle columns, each outboard column set has a sidewall column located immediately adjacent one of the sidewalls and an aisle column located immediately adjacent the aisle, the seats in each column set are non-reversed;

each seat has a seat centerline;

in each column, the seat centerline of the seats are parallel to one another and non-parallel to a longitudinal axis of an aircraft cabin;

in each outboard column set:
  the seats in the sidewall column are staggered relative to the seats in the aisle column;
  the seat centerline of the seats in the sidewall column and the aisle column are parallel to each other and are oriented at a seat angle relative to a longitudinal axis of an aircraft cabin; and in the inboard column set:
  the seats in each aisle column are staggered relative to each other;
  the seat centerline of the seats in each aisle column are parallel to each other.

* * * * *